United States Patent
Thothadri et al.

(10) Patent No.: US 11,789,300 B2
(45) Date of Patent: *Oct. 17, 2023

(54) FLEXIBLE MULTI-LAYERED COVER LENS STACKS FOR FOLDABLE DISPLAYS

(71) Applicant: Applied Materials, Inc., Santa Clara, CA (US)

(72) Inventors: Manivannan Thothadri, Mountain View, CA (US); Harvey You, Mountain View, CA (US); Helinda Nominanda, San Jose, CA (US); Neil Morrison, Seeheim-Jugenheim (DE); Daniel Paul Forster, San Jose, CA (US); Arvinder Chadha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 16/902,395

(22) Filed: Jun. 16, 2020

(65) Prior Publication Data

US 2020/0408961 A1    Dec. 31, 2020

Related U.S. Application Data

(60) Provisional application No. 62/867,144, filed on Jun. 26, 2019.

(51) Int. Cl.
*G02F 1/1333* (2006.01)
*G02B 1/14* (2015.01)
*G02B 1/11* (2015.01)

(52) U.S. Cl.
CPC .......... *G02F 1/133331* (2021.01); *G02B 1/11* (2013.01); *G02B 1/14* (2015.01);
(Continued)

(58) Field of Classification Search
CPC .......... G02F 1/133331; G02F 2201/50; G02F 1/133305; G02B 1/11; G02B 1/14;
(Continued)

(56) References Cited

U.S. PATENT DOCUMENTS

| | | |
|---|---|---|
| 6,512,512 B1 | 1/2003 | Blanchard |
| 6,660,388 B2 | 12/2003 | Liu et al. |

(Continued)

FOREIGN PATENT DOCUMENTS

| | | |
|---|---|---|
| CN | 1446371 A | 10/2003 |
| CN | 1928637 A | 3/2007 |

(Continued)

OTHER PUBLICATIONS

International Search Report and Written Opinion dated Sep. 29, 2020 for Application No. PCT/US2020/037949.

(Continued)

*Primary Examiner* — Jia X Pan
(74) *Attorney, Agent, or Firm* — PATTERSON + SHERIDAN, LLP

(57) ABSTRACT

Embodiments described and discussed herein generally relate to flexible or foldable display devices, and more specifically to flexible cover lens assemblies. In one or more embodiments, a flexible cover lens assembly contains a glass layer, an impact absorption layer disposed on the glass layer, a moisture barrier layer disposed on the impact absorption layer, a substrate disposed on the moisture barrier layer, a wet hardcoat layer having a nano-indentation hardness in a range from about 0.4 GPa to about 1.5 GPa and disposed on the substrate, an adhesion promotion layer disposed on the wet hardcoat layer, an anti-reflectance layer disposed on the adhesion promotion layer, a dry hardcoat layer having a nano-indentation hardness in a range from about 1 GPa to about 5 GPa and disposed on the anti- (Continued)

reflectance layer, and an anti-fingerprint coating layer disposed on the dry hardcoat layer.

20 Claims, 12 Drawing Sheets

(52) U.S. Cl.
CPC .... *G02F 1/133305* (2013.01); *G02F 2201/50* (2013.01); *G02F 2202/28* (2013.01)

(58) Field of Classification Search
CPC ............. H01L 51/5253; H01L 51/0097; H01L 2251/5338; G09F 9/301
See application file for complete search history.

(56) References Cited

U.S. PATENT DOCUMENTS

| | | |
|---|---|---|
| 6,781,642 B2 | 8/2004 | Nakanishi et al. |
| 6,841,190 B2 | 1/2005 | Liu et al. |
| 6,872,114 B2 | 3/2005 | Chung et al. |
| 7,071,927 B2 | 7/2006 | Blanchard |
| 7,326,313 B2 | 2/2008 | Lee et al. |
| 7,342,080 B2 | 3/2008 | Qiu et al. |
| 7,880,967 B2 | 2/2011 | Taketomo et al. |
| 8,580,378 B2 | 11/2013 | Noguchi |
| 8,618,531 B2 | 12/2013 | Alden et al. |
| 8,693,099 B2 | 4/2014 | Kawashima et al. |
| 9,023,162 B2 | 5/2015 | McCormick et al. |
| 9,475,947 B2 | 10/2016 | Sirois |
| 10,034,395 B2 | 7/2018 | Shin |
| 10,096,792 B2 | 10/2018 | Ahn et al. |
| 10,211,421 B2* | 2/2019 | Lee .................... H01L 51/56 |
| 10,237,989 B1 | 3/2019 | Peters et al. |
| 10,241,377 B1 | 3/2019 | Wang et al. |
| 10,545,537 B2 | 1/2020 | Ahn et al. |
| 10,566,570 B2 | 2/2020 | Bu et al. |
| 10,632,711 B2 | 4/2020 | Lee et al. |
| 10,752,808 B2 | 8/2020 | Ono |
| 2002/0114934 A1 | 8/2002 | Liu et al. |
| 2002/0122925 A1 | 9/2002 | Liu et al. |
| 2005/0249944 A1 | 11/2005 | Wang et al. |
| 2006/0275950 A1 | 12/2006 | Lee |
| 2007/0196633 A1 | 8/2007 | Coak et al. |
| 2008/0047468 A1 | 2/2008 | de Rojas |
| 2008/0241524 A1 | 10/2008 | Fukuda et al. |
| 2008/0311351 A1 | 12/2008 | Hsu et al. |
| 2009/0130472 A1 | 5/2009 | Kondo et al. |
| 2009/0311539 A1 | 12/2009 | Larson-Smith et al. |
| 2010/0028608 A1 | 2/2010 | Choi et al. |
| 2010/0118406 A1 | 5/2010 | Kobori et al. |
| 2010/0330359 A1 | 12/2010 | Ishikawa et al. |
| 2013/0122230 A1 | 5/2013 | Tsai et al. |
| 2013/0236713 A1 | 9/2013 | Park et al. |
| 2014/0147662 A1 | 5/2014 | Ishikawa et al. |
| 2014/0272355 A1 | 9/2014 | Sirois |
| 2014/0322471 A1 | 10/2014 | Liu et al. |
| 2014/0322472 A1 | 10/2014 | McCormick et al. |
| 2015/0109234 A1 | 4/2015 | Lotz et al. |
| 2015/0125679 A1 | 5/2015 | Ishikawa |
| 2015/0167170 A1 | 6/2015 | Ranade et al. |
| 2015/0266272 A1 | 9/2015 | Lee et al. |
| 2015/0275040 A1 | 10/2015 | Shi et al. |
| 2016/0024348 A1 | 1/2016 | Kim et al. |
| 2016/0046830 A1 | 2/2016 | Kim et al. |
| 2016/0208130 A1 | 7/2016 | Ishikawa et al. |
| 2016/0306392 A1 | 10/2016 | Park |
| 2016/0372701 A1 | 12/2016 | Kwon et al. |
| 2017/0065950 A1 | 3/2017 | Schenck et al. |
| 2017/0095993 A1 | 4/2017 | Tomomatsu et al. |
| 2017/0170416 A1 | 6/2017 | Johnson et al. |
| 2017/0179424 A1* | 6/2017 | Lee .................... H01L 51/56 |
| 2017/0183255 A1 | 6/2017 | Walther et al. |
| 2017/0183257 A1 | 6/2017 | Apitz et al. |
| 2017/0183462 A1 | 6/2017 | Song et al. |
| 2017/0253707 A1 | 9/2017 | Lim et al. |
| 2017/0276840 A1 | 9/2017 | Horio et al. |
| 2017/0298235 A1 | 10/2017 | Park et al. |
| 2018/0046220 A1* | 2/2018 | Kim .................... H01L 51/0097 |
| 2018/0132370 A1* | 5/2018 | Choi .................... B32B 27/34 |
| 2018/0196169 A1 | 7/2018 | Choi et al. |
| 2018/0264790 A1 | 9/2018 | Leatherdale et al. |
| 2018/0265731 A1 | 9/2018 | Ekinaka et al. |
| 2018/0294441 A1 | 10/2018 | Brotzman et al. |
| 2018/0346760 A1 | 12/2018 | Kim et al. |
| 2018/0372921 A1 | 12/2018 | Washio et al. |
| 2019/0086760 A1 | 3/2019 | Wang et al. |
| 2019/0131571 A1 | 5/2019 | Thothadri et al. |
| 2019/0143638 A1 | 5/2019 | Park et al. |
| 2019/0293921 A1 | 9/2019 | Nam et al. |
| 2019/0346591 A1* | 11/2019 | Thothadri ............ H05K 5/0017 |
| 2019/0377105 A1 | 12/2019 | Lim et al. |
| 2019/0383973 A1 | 12/2019 | Jang et al. |
| 2020/0020256 A1 | 1/2020 | Spiro et al. |
| 2020/0057178 A1 | 2/2020 | Thothadri et al. |
| 2020/0081162 A1 | 3/2020 | Park et al. |
| 2020/0091458 A1* | 3/2020 | Oh .................... C09J 7/38 |
| 2020/0095469 A1 | 3/2020 | Yu et al. |
| 2020/0123410 A1 | 4/2020 | Reit et al. |
| 2020/0243798 A1* | 7/2020 | Matsushita ............ G02B 1/14 |
| 2021/0041601 A1* | 2/2021 | Oh .................... B32B 27/08 |
| 2021/0185158 A1* | 6/2021 | Wang .................... C09J 7/29 |

FOREIGN PATENT DOCUMENTS

| | | |
|---|---|---|
| CN | 101418428 A | 4/2009 |
| CN | 100549064 C | 10/2009 |
| CN | 101616964 A | 12/2009 |
| CN | 101874211 A | 10/2010 |
| CN | 103085365 A | 5/2013 |
| CN | 103135159 A | 6/2013 |
| CN | 103677400 A | 3/2014 |
| CN | 104640911 A | 5/2015 |
| CN | 104765178 A | 7/2015 |
| CN | 104918780 A | 9/2015 |
| CN | 104284776 B | 1/2016 |
| CN | 106023810 A | 10/2016 |
| CN | 106232344 A | 12/2016 |
| CN | 106992221 A | 7/2017 |
| CN | 106992253 A | 7/2017 |
| CN | 106992254 A | 7/2017 |
| CN | 106992255 A | 7/2017 |
| CN | 107073886 A | 8/2017 |
| CN | 107405901 A | 11/2017 |
| CN | 107404784 A | 12/2017 |
| CN | 107452891 A | 12/2017 |
| CN | 107799574 A | 3/2018 |
| CN | 107919436 A | 4/2018 |
| CN | 108292005 A | 7/2018 |
| CN | 207817243 U | 9/2018 |
| CN | 108807463 A | 11/2018 |
| CN | 109326218 A | 2/2019 |
| CN | 109427990 A | 3/2019 |
| CN | 109642964 A | 4/2019 |
| CN | 109659332 A | 4/2019 |
| CN | 109659333 A | 4/2019 |
| CN | 109689827 A | 4/2019 |
| CN | 209102942 U | 7/2019 |
| CN | 110085138 A | 8/2019 |
| CN | 110531897 A | 12/2019 |
| CN | 110669423 A | 1/2020 |
| CN | 209890544 U | 1/2020 |
| CN | 209992964 U | 1/2020 |
| CN | 110782785 A | 2/2020 |
| CN | 110783389 A | 2/2020 |
| CN | 111051052 A | 4/2020 |
| CN | 107615103 B | 12/2020 |
| EP | 1632541 A1 | 3/2006 |
| EP | 2329888 A2 | 6/2011 |
| EP | 2981413 A1 | 2/2016 |
| EP | 2180354 B1 | 8/2017 |
| EP | 3327731 A1 | 5/2018 |
| EP | 3429845 A1 | 1/2019 |
| EP | 3417360 B1 | 9/2019 |

(56) References Cited

FOREIGN PATENT DOCUMENTS

| | | |
|---|---|---|
| EP | 3633004 A1 | 4/2020 |
| JP | H06331804 A | 12/1994 |
| JP | H10500609 A | 1/1998 |
| JP | H11337705 A | 12/1999 |
| JP | 2003019603 A * | 1/2003 |
| JP | 03411009 B2 | 5/2003 |
| JP | 2003266587 A | 9/2003 |
| JP | 2004511001 A | 4/2004 |
| JP | 2004511002 A | 4/2004 |
| JP | 03565929 B2 | 9/2004 |
| JP | 2004354828 A | 12/2004 |
| JP | 03615171 B2 | 1/2005 |
| JP | 2005017544 A | 1/2005 |
| JP | 2005055724 A | 3/2005 |
| JP | 2005144719 A | 6/2005 |
| JP | 2005178176 A | 7/2005 |
| JP | 2005280131 A | 10/2005 |
| JP | 03751922 B2 | 3/2006 |
| JP | 2006071982 A | 3/2006 |
| JP | 2006155452 A | 6/2006 |
| JP | 03802842 B2 | 7/2006 |
| JP | 2007025077 A | 2/2007 |
| JP | 03942039 B2 | 7/2007 |
| JP | 2007216435 A | 8/2007 |
| JP | 2008001929 A | 1/2008 |
| JP | 2008110550 A | 5/2008 |
| JP | 2010069675 | 4/2010 |
| JP | 4793056 B2 | 10/2011 |
| JP | 5201369 B2 | 6/2013 |
| JP | 2013107382 A | 6/2013 |
| JP | 05296410 B2 | 9/2013 |
| JP | 5518374 B2 | 6/2014 |
| JP | 2014102320 A | 6/2014 |
| JP | 2015003510 A | 1/2015 |
| JP | 2015174270 A | 10/2015 |
| JP | 2015197487 A | 11/2015 |
| JP | 2015533685 A | 11/2015 |
| JP | 2017074797 A | 4/2017 |
| JP | 2017125876 A | 7/2017 |
| JP | 2017126620 A | 7/2017 |
| JP | 2017128136 A | 7/2017 |
| JP | 2017523949 A | 8/2017 |
| JP | 6207679 B2 | 10/2017 |
| JP | 2017529305 A | 10/2017 |
| JP | 2017227898 A | 12/2017 |
| JP | 2018024567 A | 2/2018 |
| JP | 2018509369 A | 4/2018 |
| JP | 2018109773 A | 7/2018 |
| JP | 2018159913 A | 10/2018 |
| JP | 2018180274 A | 11/2018 |
| JP | 06532929 B2 | 6/2019 |
| JP | 6542970 B2 | 7/2019 |
| JP | 6787673 B2 | 11/2020 |
| JP | 2021501439 A | 1/2021 |
| JP | 2021523413 A | 9/2021 |
| KR | 550377 A | 2/2006 |
| KR | 2008034534 A | 4/2008 |
| KR | 2016071174 A | 6/2016 |
| KR | 2016095308 A | 8/2016 |
| KR | 2016103681 A | 9/2016 |
| KR | 2017001102 A | 1/2017 |
| KR | 2017019840 A | 2/2017 |
| KR | 2017019865 A | 2/2017 |
| KR | 2017021033 A | 2/2017 |
| KR | 2017041368 A | 4/2017 |
| KR | 2017041369 A | 4/2017 |
| KR | 2017051909 A | 5/2017 |
| KR | 2017051911 A | 5/2017 |
| KR | 2017059158 A | 5/2017 |
| KR | 2017075663 A | 7/2017 |
| KR | 2017078159 A | 7/2017 |
| KR | 2017097381 A | 8/2017 |
| KR | 2017097401 A | 8/2017 |
| KR | 20170090339 A | 8/2017 |
| KR | 2017103395 A | 9/2017 |
| KR | 20170103644 A | 9/2017 |
| KR | 1788596 B1 | 10/2017 |
| KR | 20170113815 A | 10/2017 |
| KR | 2017136033 A | 12/2017 |
| KR | 2018001175 A | 1/2018 |
| KR | 1854524 B1 | 5/2018 |
| KR | 20180052810 A | 5/2018 |
| KR | 2018067864 A | 6/2018 |
| KR | 2018067865 A | 6/2018 |
| KR | 2018073987 A | 7/2018 |
| KR | 2018074544 A | 7/2018 |
| KR | 2018083171 A | 7/2018 |
| KR | 2018093649 A | 8/2018 |
| KR | 2018096996 A | 8/2018 |
| KR | 1938413 B1 | 1/2019 |
| KR | 1948655 B1 | 2/2019 |
| KR | 20190012847 A | 2/2019 |
| KR | 20190019069 A | 2/2019 |
| KR | 2019030912 A | 3/2019 |
| KR | 1971832 B1 | 4/2019 |
| KR | 2019039465 A | 4/2019 |
| KR | 2019039466 A | 4/2019 |
| KR | 2019043427 A | 4/2019 |
| KR | 2019043428 A | 4/2019 |
| KR | 2019044267 A | 4/2019 |
| KR | 2019044360 A | 4/2019 |
| KR | 2019060463 A | 6/2019 |
| KR | 2019081823 A | 7/2019 |
| KR | 2009962 B1 | 8/2019 |
| KR | 2017142 B1 | 9/2019 |
| KR | 2019104565 A | 9/2019 |
| KR | 2019109024 A | 9/2019 |
| KR | 2019109113 A | 9/2019 |
| KR | 2031275 B1 | 10/2019 |
| KR | 2039737 B1 | 11/2019 |
| KR | 2043333 B1 | 11/2019 |
| KR | 2047504 B1 | 11/2019 |
| KR | 2047512 B1 | 11/2019 |
| KR | 2019128557 A | 11/2019 |
| KR | 2019130490 A | 11/2019 |
| KR | 2060541 B1 | 12/2019 |
| KR | 2076281 B1 | 2/2020 |
| KR | 2020021406 A | 2/2020 |
| KR | 2020021407 A | 2/2020 |
| KR | 2088674 B1 | 3/2020 |
| KR | 2020022168 A | 3/2020 |
| KR | 2020025036 A | 3/2020 |
| KR | 2020025472 A | 3/2020 |
| KR | 2020030663 A | 3/2020 |
| KR | 2020041042 A | 4/2020 |
| TW | 201318864 A | 5/2013 |
| TW | 201441048 A | 11/2014 |
| TW | 201500433 A | 1/2015 |
| TW | 201508827 A | 3/2015 |
| TW | 201525081 A | 7/2015 |
| TW | 201729996 A | 9/2017 |
| TW | 201838815 A | 11/2018 |
| TW | 201922478 A | 6/2019 |
| WO | 2014141866 A1 | 9/2014 |
| WO | 2014163352 A1 | 10/2014 |
| WO | 2017026318 A1 | 2/2017 |
| WO | 2017054188 A1 | 4/2017 |
| WO | 2017073903 A1 | 5/2017 |
| WO | 2017116103 A1 | 7/2017 |
| WO | 2017217526 A1 | 12/2017 |
| WO | 2018070523 A1 | 4/2018 |
| WO | 2018130289 A1 | 7/2018 |
| WO | 2018159918 A1 | 9/2018 |
| WO | 2018186262 A1 | 10/2018 |
| WO | 2018208760 A1 | 11/2018 |
| WO | 2018230495 A1 | 12/2018 |
| WO | 2019046441 A1 | 3/2019 |
| WO | 2019083606 A1 | 5/2019 |
| WO | 2019085486 A1 | 5/2019 |
| WO | 2019147915 A1 | 8/2019 |
| WO | 2019168005 A1 | 9/2019 |

(56) References Cited

FOREIGN PATENT DOCUMENTS

WO    2019217565 A1    11/2019
WO    2019237254 A1    12/2019

OTHER PUBLICATIONS

International Search Report and Written Opinion dated Sep. 29, 2020 for Application No. PCT/US2020/037952.
International Search Report and Written Opinion dated Sep. 29, 2020 for Application No. PCT/US2020/037956.
International Search Report and Written Opinion dated Sep. 29, 2020 for Application No. PCT/US2020/037958.
Japanese Office Action dated Mar. 30, 2021 for Application No. 2020-522838.
Anonymous: "The Pencil Hardness Test", Dec. 4, 2016, XP055818807, http://web.archive.org/web/20161204152411/http://www.pencilpages.com/articles/simmons.htm, p. 2.
Extended European Search Report dated Jul. 8, 2021 for Application No. 18871752.4.
Taiwan Office Action dated Jul. 20, 2021 for Application No. 109120632.
Taiwan Office Action dated Sep. 3, 2021 for Application No. 107130254.
Taiwanese Office Action and Search Report for TW Application No. 108123820 dated Jul. 30, 2020.
Taiwan Office Action dated Aug. 27, 2020 for Application No. 108116194.
PCT International Search Report/Written Opinion dated Dec. 12, 2018 for Application No. PCT/US2018/048391.
Day-Shan Liu et al: "Adhesion enhancement of hard coatings deposited on flexible plastic substrates using an interfacial buffer layer", Journal of Physics D: Applied Physics, Institute of Physics Publishing Ltd, GB, vol. 43, No. 17, May 5, 2010 (May 5, 2019), p. 175301, XP020171087, ISSN: 0022-3727 Experiment; table 1.
Kuhr M et al: "Coatings on plastics with the PICVD technology", Thin Solid F, Elsevier, Amsterdam, NL, vol. 442, No. 1-2, Sep. 17, 2003 (Sep. 17, 2003), pp. 107-116, XP004458307, ISSN: 0040-6090, DOI: 10.1016/S0040-6090(03)00956-8 Experimental.
International Search Report and Written Opinion dated Aug. 28, 2019 for Application No. PCT/US2019/031337.
International Search Report and the Written Opinion for International Application No. PCT/US2019/040402 dated Oct. 18, 2019.
Chinese Office Action dated Sep. 3, 2021 for Application No. 201980029310.7.
Chinese Office Action dated Oct. 11, 2021 for Application No. 201880069545.4.
Chinese Office Action dated Nov. 7, 2022 for Application No. 202080046775.6.
Taiwan Office Action dated Sep. 6, 2022 for Application No. 109120632.
Chinese Office Action dated Mar. 1, 2023 for Application No. 202080046782.6.
Korean Office Action dated Mar. 23, 2023 for Application No. 10-2022-7002574.
Korean Office Action dated Mar. 24, 2023 for Application No. 10-2022-7002578.
Korean Office Action dated Mar. 27, 2023 for Application No. 10-2022-7002593.
Korean Office Action dated Mar. 28, 2023 for Application No. 10-2022-7002602.
Chinese Office Action dated Feb. 24, 2023 for Application No. 202080046786.4.
Japanese Office Action dated Jan. 24, 2023 for Application No. 2021-576445.
Japanese Office Action dated Jan. 24, 2023 for Application No. 2021-576444.
Japanese Office Action dated Jan. 31, 2023 for Application No. 2021-575952.
Japanese Office Action dated Feb. 14, 2023 for Application No. 2021-575954.
Chinese Office Action dated May 13, 2023 for Application No. 202080046775.6.
Japanese Office Action dated May 30, 2023 for Application No. 2021-576444.
Supplementary European Search Report dated Jun. 16, 2023 for Application No. 20831518.4.
Xianghuai, L. et al., "Synthesis of gradient thin films by ion beam enhanced deposition", Materals Science, Elsevier, Amsterdam, NL, vol. 139, Jul. 1, 1991 (Jul. 1, 1991), pp. 220-224.
Japanese Office Action dated Jul. 25, 2023 for Application No. 2021-575954.
Japanese Office Action dated Aug. 1, 2023 for Application No. 2021-575952.
Extended European Search Report dated Jul. 3, 2020 for Application No. 20832594.4.

* cited by examiner

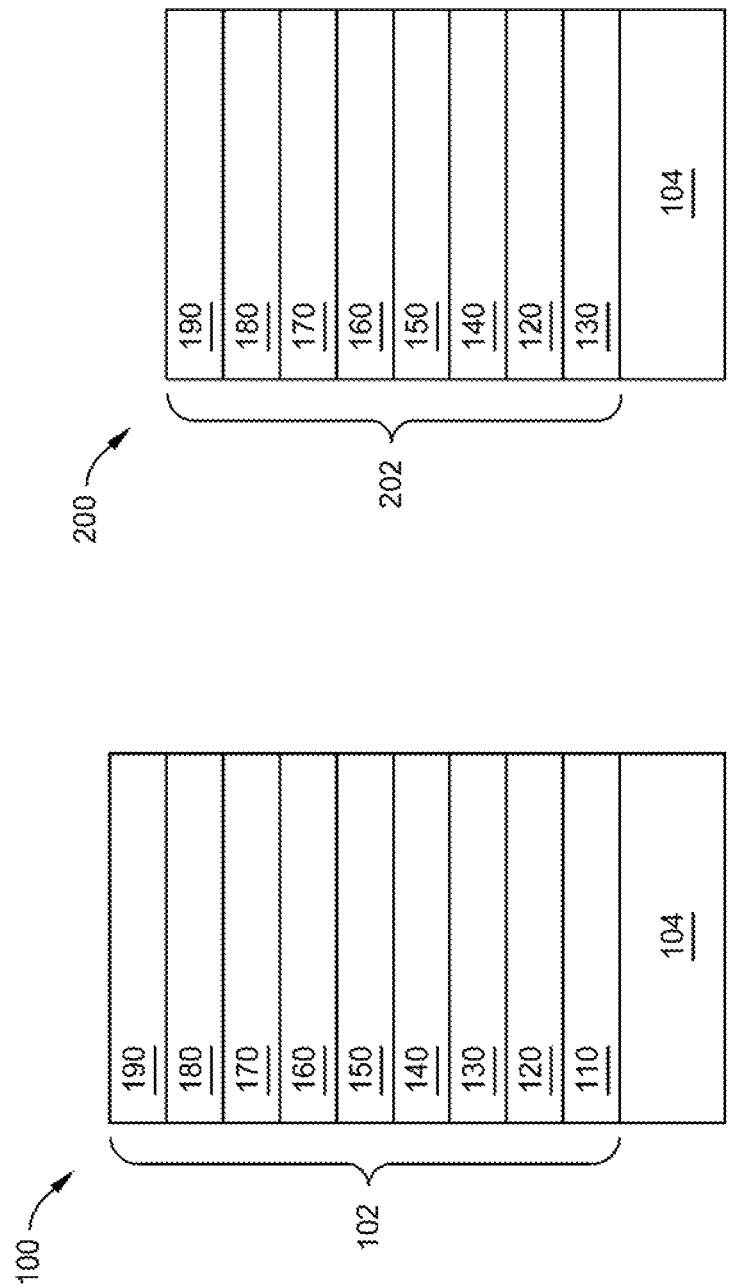

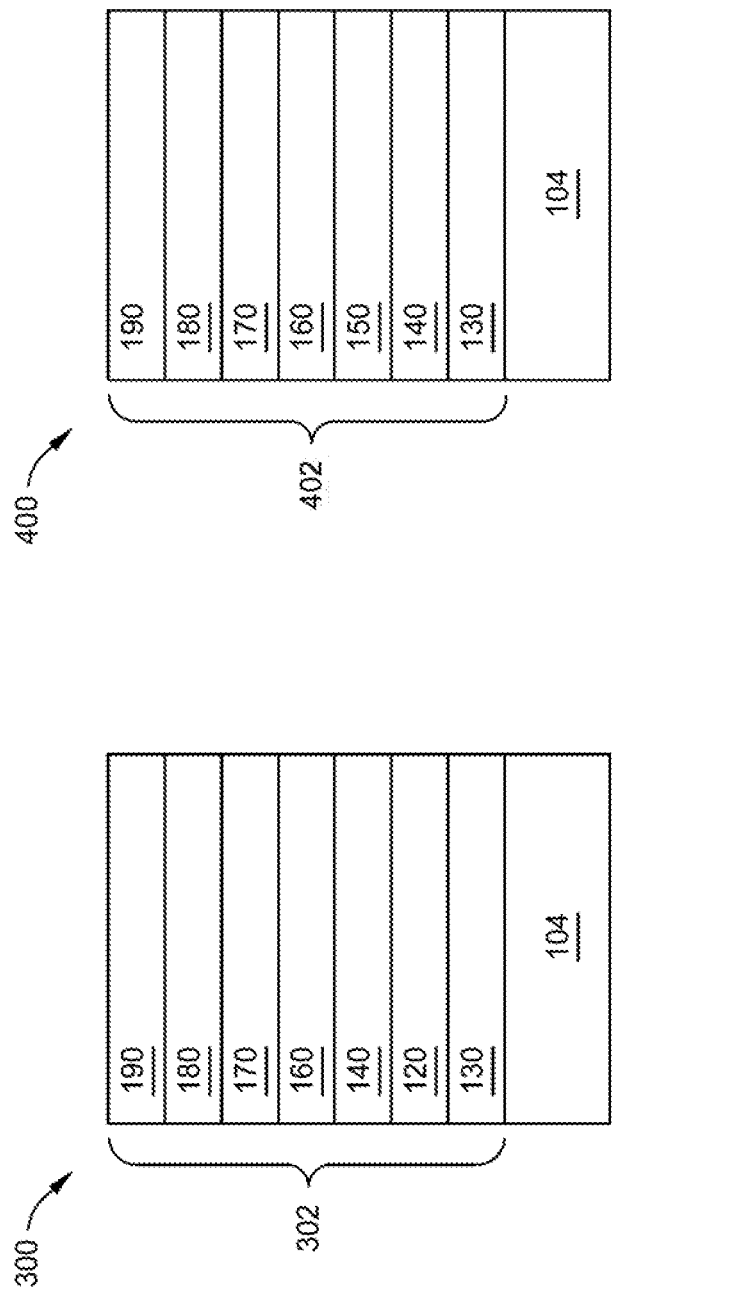

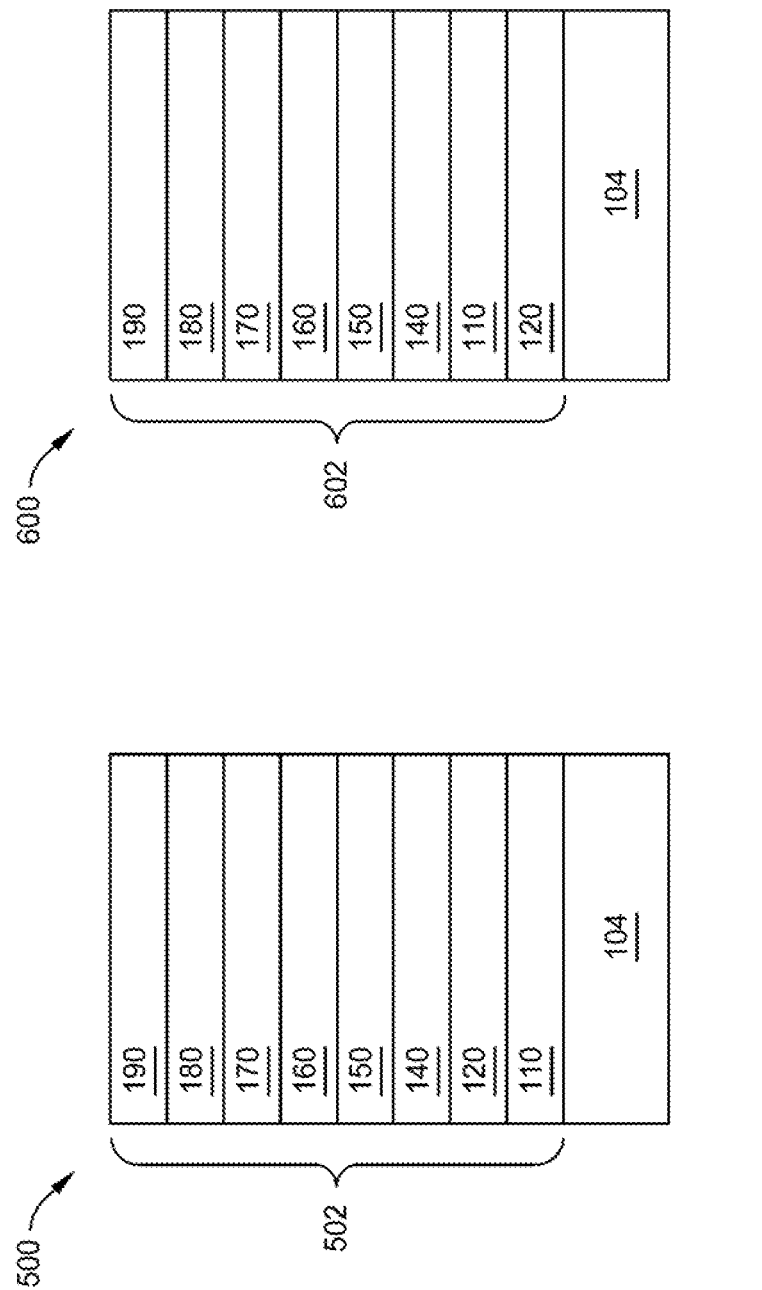

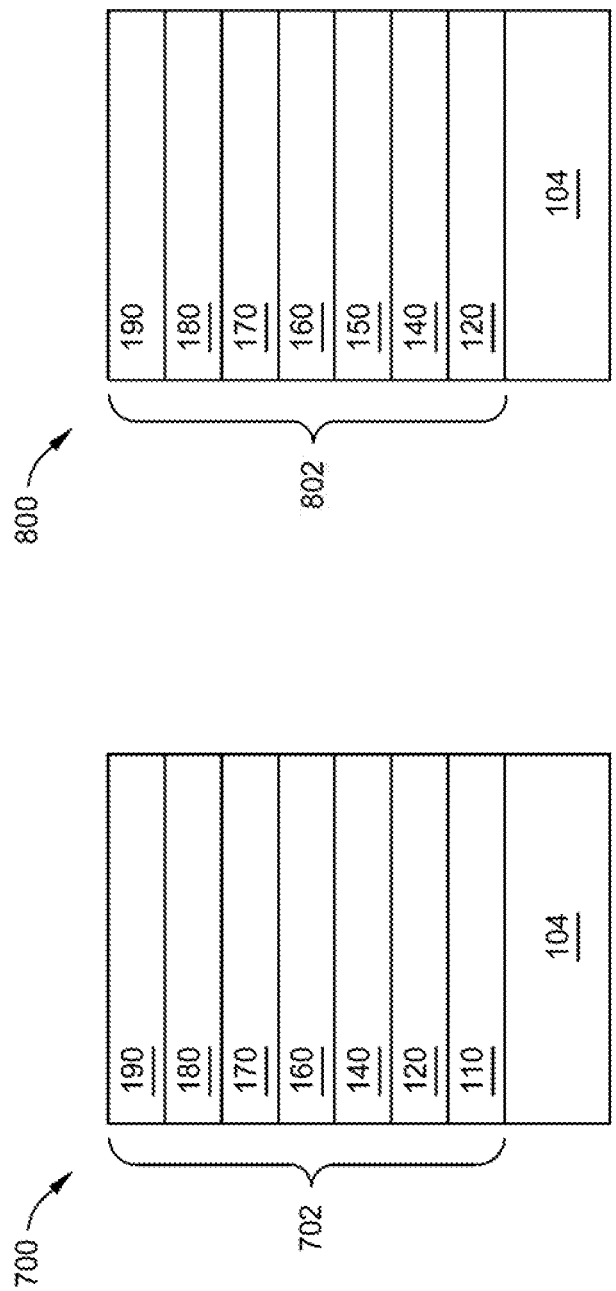

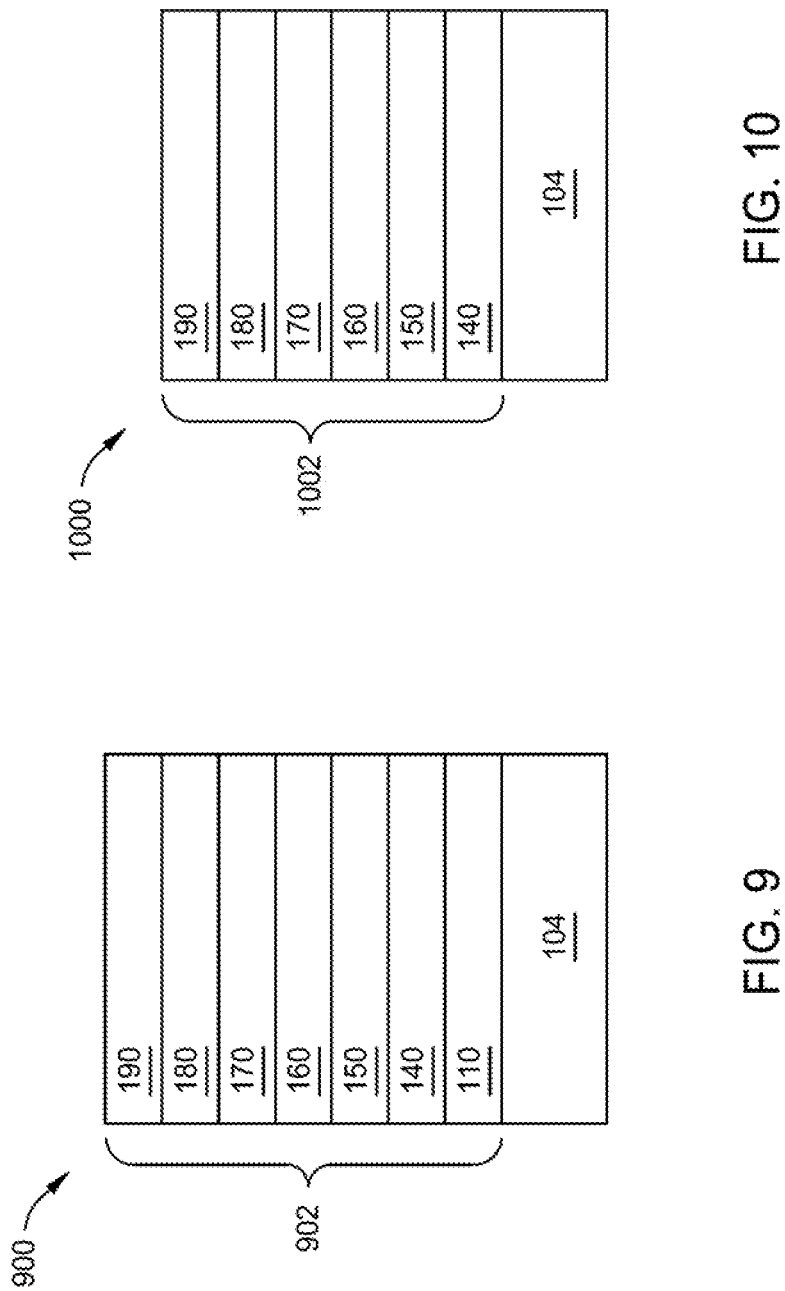

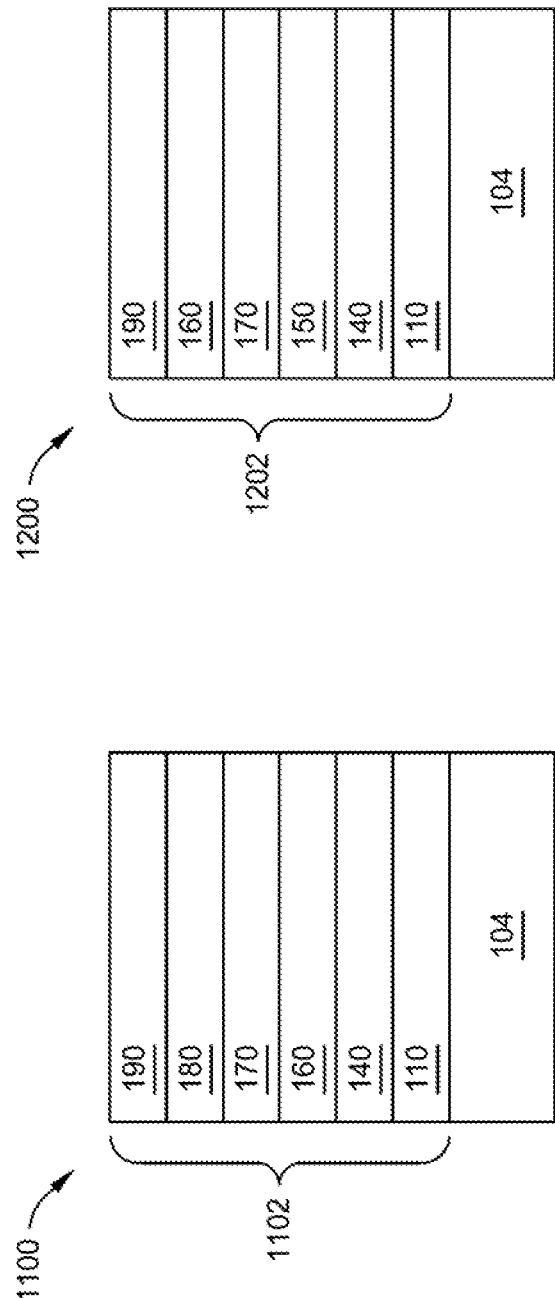

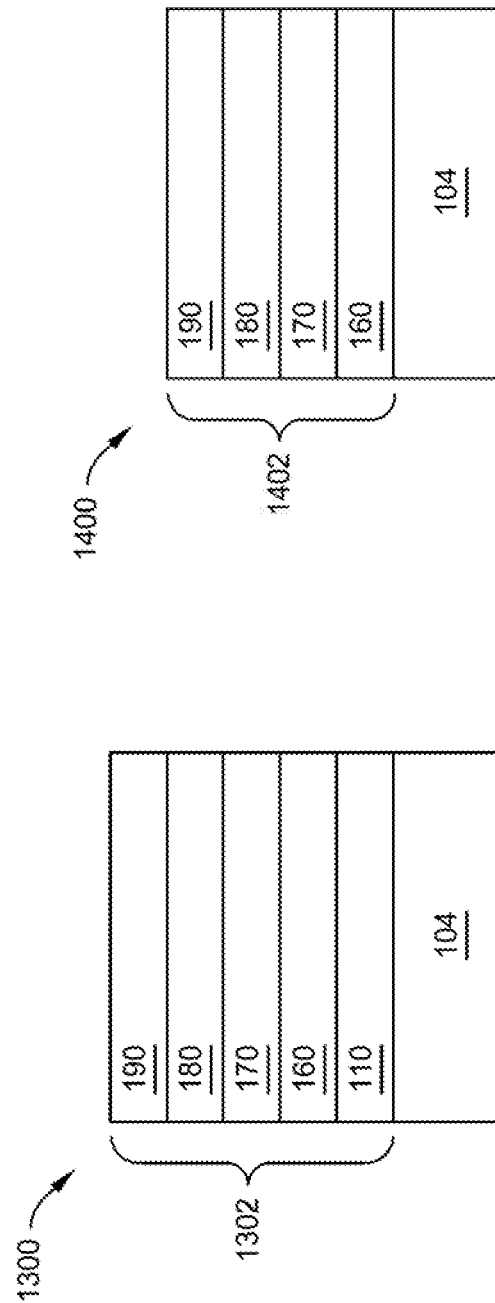

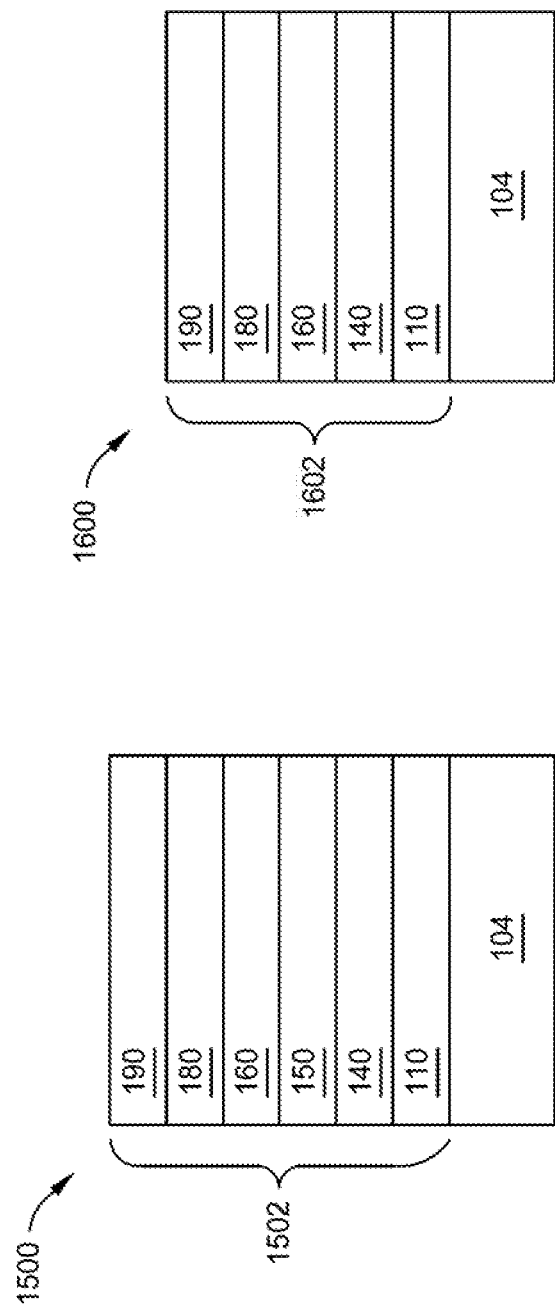

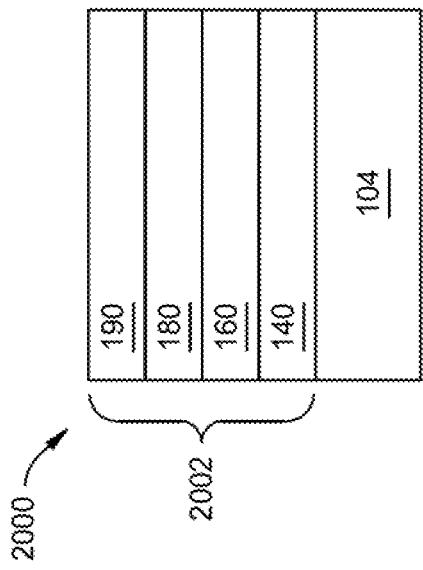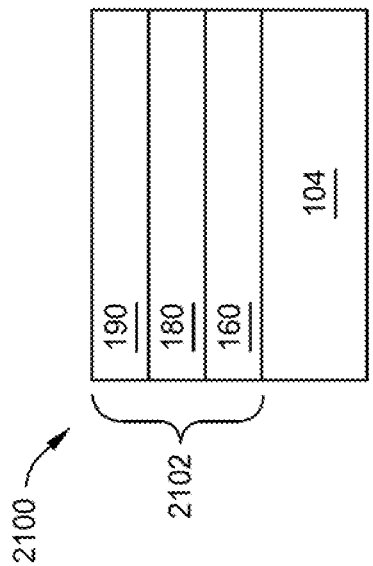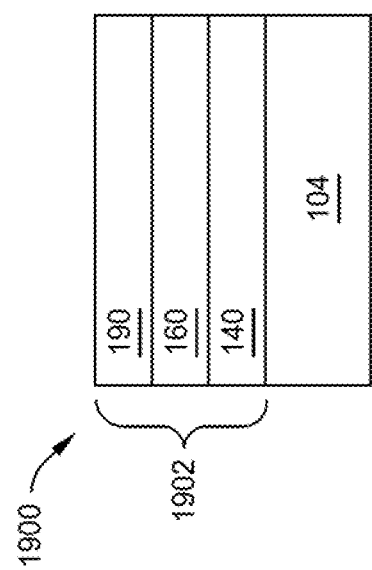

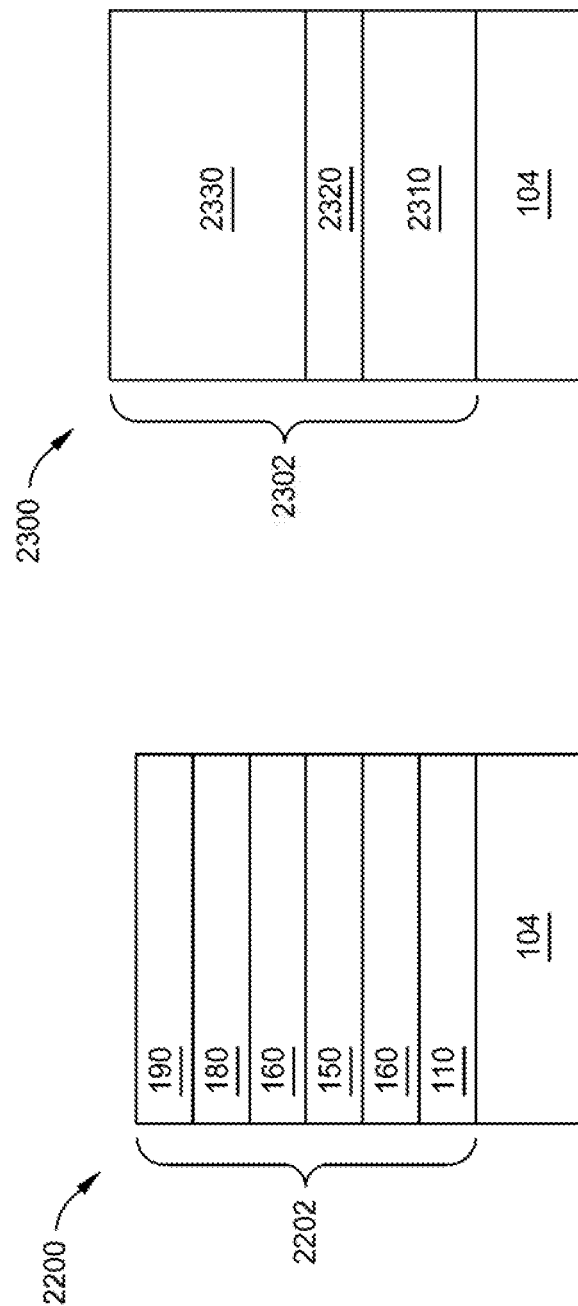

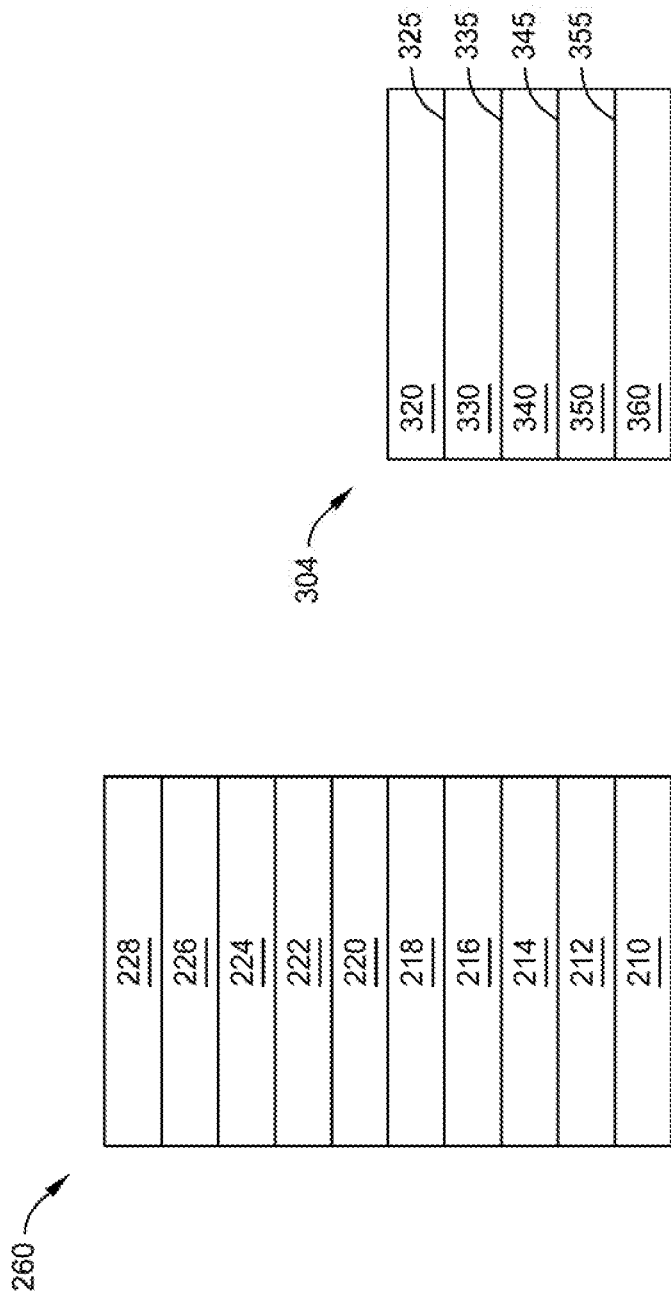

FLEXIBLE MULTI-LAYERED COVER LENS STACKS FOR FOLDABLE DISPLAYS

CROSS-REFERENCE TO RELATED APPLICATIONS

This application claims benefit to U.S. Appl. No. 62/867,144, filed on Jun. 26, 2019, which is herein incorporated by reference.

BACKGROUND

Field

Implementations described herein generally relate to flexible or foldable display devices, and more specifically to flexible or foldable cover lens.

Description of the Related Art

Electronic devices often have displays such as liquid crystal displays (LCDs), organic light emitting-diode (OLED) displays, and quantum dot (QIP) displays. Such displays can be fragile and sensitive to moisture, pressure, or particle contamination. Generally, display devices use several layers of optical devices to colorize, polarize, and shutter light from an illumination source. To prevent damage to the underlying film, a rigid display cover lens layer is mounted over the other layers to prevent damage to the underlying layers. The inclusion of the rigid display cover lens can add undesirable weight to an electronic device. The cover lens can be omitted to reduce the size and weight of a device, but omitting the cover lens can make the display susceptible to damage from scratches.

An increasing demand for new functionalities of products and exploiting new and broad applications calls for thinner and lighter lens substrates with new properties such as flexibility. Broadly, three main characteristics are desired from a cover lens for these new flexible or foldable displays: 1) optical performance, 2) high hardness, and 3) flexibility. Good optical performance ensures good transmission of light with very little haze. High hardness relates to scratch and abrasion resistance. Foldability (e.g., relative high degree of flexibility) in cover lenses is in terms of having a high enough critical strain that failure due to crack or delamination is avoided when repeatedly bent and folded.

Traditionally, while cover lenses have been excellent at addressing the first two characteristics (e.g., optical performance and hardness), cover lenses have been poor at the third characteristic, e.g., flexibility or foldability, due to the brittle nature of the cover lenses. To improve flexibility, significant prior effort has gone into increasing the critical-strain at failure for glass, mainly by reducing the thickness of glass or chemical modification of the materials. Nonetheless, glass as a material for cover lens has been found such that when the glass fails the entire cover has to be replaced. Alternate solutions for cover lenses may bring excellent optical performance and flexibility but are typically vulnerable to abrasion and or scratches. Once damaged by scratches, the entire cover has to be replaced, Replacing the cover lens requires specific expertise, time, and is done at a great expense.

Therefore, there is a need for improved display cover lens for flexible or foldable displays.

SUMMARY

Embodiments described and discussed herein generally relate to flexible or foldable display devices, and more specially to flexible cover lens assemblies. In one or more embodiments, a flexible cover lens assembly contains a glass layer, an adhesion promotion layer on the glass layer, an anti-reflectance layer disposed on the adhesion promotion layer, a dry hardcoat layer having a nano-indentation hardness in a range from about 1 GPa to about 5 GPa and disposed on the anti-reflectance layer, and an anti-fingerprint coating layer disposed on the dry hardcoat layer.

In some embodiments, a flexible cover lens assembly contains a glass layer, a substrate disposed on the glass layer, an adhesion promotion layer on the substrate, an anti-reflectance layer disposed on the adhesion promotion layer, a dry hardcoat layer having a porosity of about 1% to about 7% and disposed on the anti-reflectance layer, and an anti-fingerprint coating layer disposed on the dry hardcoat layer.

In other embodiments, a flexible cover lens assembly contains a glass layer, a substrate disposed on the glass layer, a wet hardcoat layer having a nano-indentation hardness in a range from about 0.4 GPa to about 1.5 GPa and disposed on the substrate, an anti-reflectance layer disposed on the wet hardcoat layer, an adhesion promotion layer disposed on the anti-reflectance layer, and an anti-fingerprint coating layer disposed on the adhesion promotion layer.

In one or more embodiments, a flexible cover lens assembly contains a glass layer, an adhesion promotion layer disposed on the glass layer, a dry hardcoat layer having a nano-indentation hardness in a range from about 1 GPa to about 5 GPa and disposed on the adhesion promotion layer and an anti-fingerprint coating layer disposed on the dry hardcoat layer.

In some embodiments, a flexible cover lens assembly contains a glass layer, a substrate disposed on the glass layer, an adhesion promotion layer disposed on the substrate, a dry hardcoat layer having a porosity of about 1% to about 7% and disposed on the adhesion promotion layer, and an anti-fingerprint coating layer disposed on the dry hardcoat layer.

In other embodiments, a flexible cover lens assembly contains a glass layer, a substrate disposed on the glass layer, a wet hardcoat layer having a nano-indentation hardness in a range from about 0.4 GPa to about 1.5 GPa and disposed on the substrate, an adhesion promotion layer disposed on the wet hardcoat layer, a dry hardcoat layer disposed on the adhesion promotion layer and having a nano-indentation hardness in a range from about 1 GPa to about 5 GPa and a porosity of about 1% to about 7%, and an anti-fingerprint coating layer disposed on the dry hardcoat layer.

In one or more embodiments, a flexible cover lens assembly contains a substrate, an anti-fingerprint coating layer, and an adhesion promotion layer disposed between the substrate and the anti-fingerprint coating layer.

In some embodiments, a flexible cover lens assembly contains a substrate, an adhesion promotion layer disposed on the substrate, a dry hardcoat layer disposed on the adhesion promotion layer and having a porosity of about 1% to about 7% and a nano-indentation hardness in a range from about 1 GPa to about 5 GPa, and an anti-fingerprint coating layer disposed on the dry hardcoat layer.

In other embodiments, a flexible cover lens assembly contains a substrate, a wet hardcoat layer having a nano-indentation hardness in a range from about 0.4 GPa to about 1.5 GPa and disposed on the substrate, an adhesion promotion layer disposed on the wet hardcoat layer, a dry hardcoat layer having a nano-indentation hardness in a range from about 1 GPa to about 5 GPa and disposed on the adhesion promotion layer, and an anti-fingerprint coating layer disposed on the dry hardcoat layer.

In one or more embodiments, a flexible cover lens assembly contains a glass layer, an impact absorption layer disposed on the glass layer, a moisture barrier layer disposed on the impact absorption layer, a substrate disposed on the moisture barrier layer, a wet hardcoat layer having a nano-indentation hardness in a range from about 0.4 GPa to about 1.5 GPa and disposed on the substrate, an adhesion promotion layer disposed on the wet hardcoat layer, an anti-reflectance layer disposed on the adhesion promotion layer, a dry hardcoat layer having a nano-indentation hardness in a range from about 1 GPa to about 5 GPa and disposed on the anti-reflectance layer, and an anti-fingerprint coating layer disposed on the dry hardcoat layer.

In some embodiments, a flexible cover lens assembly contains a glass layer, a first adhesion promotion layer disposed on the glass layer, a wet hardcoat layer having a nano-indentation hardness in a range from about 0.4 GPa to about 1.5 GPa and disposed on the first adhesion promotion layer, a second adhesion promotion layer disposed on the wet hardcoat layer, a dry hardcoat layer having a nano-indentation hardness in a range from about 1 GPa to about 5 GPa and disposed on the second adhesion promotion layer, and an anti-fingerprint coating layer disposed on the dry hardcoat layer.

In other embodiments, a flexible cover lens assembly contains a glass layer, a first adhesion promotion layer disposed on the glass layer, a wet hardcoat layer having a porosity of about 6% to about 10% and disposed on the first adhesion promotion layer, a second adhesion promotion layer disposed on the wet hardcoat layer, a dry hardcoat layer having a porosity of about 1% to about 7% and disposed on the second adhesion promotion layer, and an anti-fingerprint coating layer disposed on the dry hardcoat layer, where the flexible cover lens assembly has a critical strain of greater than 1% to about 15%.

In some embodiments, a flexible cover lens assembly contains a substrate, an anti-fingerprint coating layer, and an adhesion promotion layer disposed between the substrate and the anti-fingerprint coating layer. In some examples, the flexible cover lens assembly also contains a dry hardcoat layer disposed between the adhesion promotion layer and the anti-fingerprint coating layer. In other embodiments, a flexible cover lens assembly contains an anti-fingerprint coating layer, an adhesion promotion layer, and a dry hardcoat layer disposed between the adhesion promotion layer and the anti-fingerprint coating layer.

In one or more embodiments, a flexible cover lens assembly contains a substrate, a wet hardcoat layer disposed on the substrate, an adhesion promotion layer disposed on the wet hardcoat layer, a dry hardcoat layer disposed on the adhesion promotion layer, and an anti-fingerprint coating layer disposed on the dry hardcoat layer.

In other embodiments, a flexible cover lens assembly contains a glass layer, an adhesion promotion layer disposed on the glass layer, a second or dry hardcoat disposed on the adhesion promotion layer, and an anti-fingerprint coating layer disposed on the dry hardcoat layer. In one or more examples, the flexible cover lens assembly also includes a substrate disposed between the glass layer and the adhesion promotion layer. In other examples, the flexible cover lens assembly includes a wet hardcoat layer disposed between the substrate and the adhesion promotion layer.

In some embodiments, a flexible cover lens assembly contains an adhesion promotion layer, an anti-reflectance layer disposed on the adhesion promotion layer, a dry hardcoat layer disposed on the anti-reflectance layer, and an anti-fingerprint coating layer disposed on the dry hardcoat layer. In some examples, the flexible cover lens assembly further contains a glass layer disposed on the adhesion promotion layer, wherein the adhesion promotion layer is disposed between the glass layer and the anti-reflectance layer. In other examples, the flexible cover lens assembly also contains a substrate disposed between the glass layer and the adhesion promotion layer.

In one or more embodiments, a flexible cover lens assembly contains a glass layer, a substrate disposed on the glass layer, a wet hardcoat layer disposed on the substrate, an anti-reflectance layer disposed on the wet hardcoat layer, an adhesion promotion layer disposed on the anti-reflectance layer, and an anti-fingerprint coating layer disposed on the adhesion promotion layer.

In other embodiments, a flexible cover lens assembly contains a substrate, a wet hardcoat layer disposed on the substrate, an adhesion promotion layer disposed on the wet hardcoat layer, an anti-reflectance layer disposed on the adhesion promotion layer, a dry hardcoat layer disposed on the anti-reflectance layer, and an anti-fingerprint coating layer disposed on the dry hardcoat layer.

In some embodiments, a flexible cover lens assembly contains a glass layer, a substrate disposed on the glass layer, a wet hardcoat layer disposed on the substrate, an adhesion promotion layer disposed on the wet hardcoat layer, an anti-reflectance layer disposed on the adhesion promotion layer, a dry hardcoat layer disposed on the anti-reflectance layer, and an anti-fingerprint coating layer disposed on the dry hardcoat layer.

In one or more embodiments, a flexible cover lens assembly contains a glass layer, an impact absorption layer disposed on the glass layer, a substrate disposed on the impact absorption layer, an adhesion promotion layer disposed on the substrate, an anti-reflectance layer disposed on the adhesion promotion layer, a dry hardcoat layer disposed on the anti-reflectance layer, and an anti-fingerprint coating layer disposed on the dry hardcoat layer. In some examples, the flexible cover lens assembly further includes a wet hardcoat layer disposed between the substrate and the adhesion promotion layer.

In other embodiments, a flexible cover lens assembly contains an impact absorption layer, a substrate disposed on the impact absorption layer, a wet hardcoat layer disposed on the substrate, an adhesion promotion layer disposed on the wet hardcoat layer, an anti-reflectance layer disposed on the adhesion promotion layer, a dry hardcoat layer disposed on the anti-reflectance layer, and an anti-fingerprint coating layer disposed on the dry hardcoat layer. In one or more examples, the flexible cover lens assembly further includes a glass layer disposed between the impact absorption layer and the substrate.

In some embodiments, a flexible cover lens assembly contains a moisture barrier layer, a substrate disposed on the moisture barrier layer, a wet hardcoat layer disposed on the substrate, an adhesion promotion layer disposed on the wet hardcoat layer, an anti-reflectance layer disposed on the adhesion promotion layer, a dry hardcoat layer disposed on the anti-reflectance layer, and an anti-fingerprint coating layer disposed on the dry hardcoat layer. In some examples, the flexible cover lens assembly contains an impact absorption layer disposed between the moisture barrier layer and the substrate.

In one or more embodiments, a flexible cover lens assembly contains a moisture barrier layer, an impact absorption layer disposed on the moisture barrier layer, a substrate disposed on the impact absorption layer, an adhesion promotion layer disposed on the substrate, an anti-reflectance layer disposed on the adhesion promotion layer, a dry hardcoat layer disposed on the anti-reflectance layer, and an anti-fingerprint coating layer disposed on the dry hardcoat layer.

In one or more embodiments, a flexible and replaceable cover lens stack contains a first flexible cover lens, a second flexible cover lens, and a sacrificial adhesion layer disposed between the first flexible cover lens and the second flexible cover lens. Each of the first flexible cover lens and the second flexible cover lens is or includes any one of the flexible cover lens assemblies described and discussed herein, where the first and second cover lens are different.

In other embodiments, a display device includes any one of the flexible cover lens assemblies described and discussed herein and a flexible display structure, such as, for example an OLED display or an LCD display.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

FIG. 1 depicts a schematic, cross-sectional view of a display device containing a flexible cover lens assembly, according to one or more embodiments described and discussed herein.

FIG. 2 depicts a schematic, cross-sectional view of a display device containing another flexible cover lens assembly, according to one or more embodiments described and discussed herein.

FIG. 3 depicts a schematic, cross-sectional view of a display device containing another flexible cover lens assembly, according to one or more embodiments described and discussed herein.

FIG. 4 depicts a schematic, cross-sectional view of a display device containing another flexible cover lens assembly, according to one or more embodiments described and discussed herein.

FIG. 5 depicts a schematic, cross-sectional view of a display device containing another flexible cover lens assembly, according to one or more embodiments described and discussed herein.

FIG. 6 depicts a schematic, cross-sectional view of a display device containing another flexible cover lens assembly, according to one or more embodiments described and discussed herein.

FIG. 7 depicts a schematic, cross-sectional view of a display device containing another flexible cover lens assembly, according to one or more embodiments described and discussed herein.

FIG. 8 depicts a schematic, cross-sectional view of a display device containing another flexible cover lens assembly, according to one or more embodiments described and discussed herein.

FIG. 9 depicts a schematic, cross-sectional view of a display device containing another flexible cover lens assembly, according to one or more embodiments described and discussed herein.

FIG. 10 depicts a schematic, cross-sectional view of a display device containing another flexible cover lens assembly, according to one or more embodiments described and discussed herein.

FIG. 11 depicts a schematic, cross-sectional view of a display device containing another flexible cover lens assembly, according to one or more embodiments described and discussed herein.

FIG. 12 depicts a schematic, cross-sectional view of a display device containing another flexible cover lens assembly, according to one or more embodiments described and discussed herein.

FIG. 13 depicts a schematic, cross-sectional view of a display device containing another flexible cover lens assembly, according to one or more embodiments described and discussed herein.

FIG. 14 depicts a schematic, cross-sectional view of a display device containing another flexible cover lens assembly, according to one or more embodiments described and discussed herein.

FIG. 15 depicts a schematic, cross-sectional view of a display device containing another flexible cover lens assembly, according to one or more embodiments described and discussed herein.

FIG. 16 depicts a schematic, cross-sectional view of a display device containing another flexible cover lens assembly, according to one or more embodiments described and discussed herein.

FIG. 19 depicts a schematic, cross-sectional view of a display device containing another flexible cover lens assembly, according to one or more embodiments described and discussed herein.

FIG. 20 depicts a schematic, cross-sectional view of a display device containing another flexible cover lens assembly, according to one or more embodiments described and discussed herein.

FIG. 21 depicts a schematic, cross-sectional view of a display device containing another flexible cover lens assembly, according to one or more embodiments described and discussed herein.

FIG. 22 depicts a schematic, cross-sectional view of a display device containing another flexible cover lens assembly, according to one or more embodiments described and discussed herein.

FIG. 23 depicts a schematic, cross-sectional view of a flexible and replaceable cover lens stack, according to one or more embodiments described and discussed herein.

FIG. 24 depicts a schematic, cross-sectional view of an adhesion promotion layer containing a plurality of sublayers, according to one or more embodiments described and discussed herein.

FIG. 25 depicts a schematic, cross-sectional view of a display structure according to one or more embodiments described and discussed herein.

Figure 18:
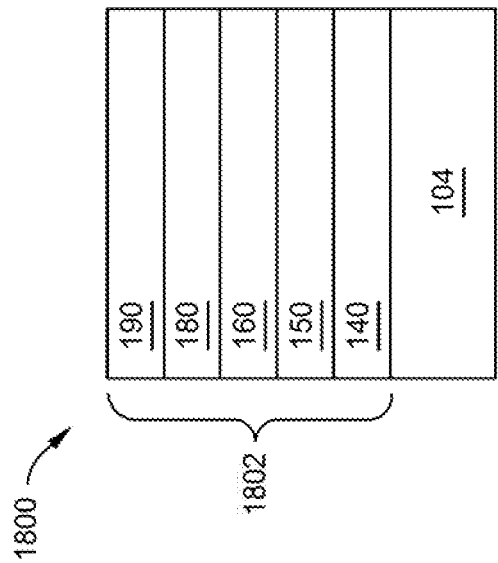
FIG. 18 depicts a schematic, cross-sectional view of a display device containing another flexible cover lens assembly, according to one or more embodiments described and discussed herein.

To facilitate understanding, identical reference numerals have been used, where possible, to designate identical elements that are common to the Figures. It is contemplated that elements and features of one implementation may be beneficially incorporated in other implementations without further recitation.

DETAILED DESCRIPTION

Implementations described herein generally relate to flexible display devices, and more specifically to cover lens assemblies containing flexible cover lens with multi-layer film stacks.

FIG. 1 depicts a schematic, cross-sectional view of a display device 100 containing a flexible cover lens assembly 102 disposed on a flexible display structure or flexible display stack (FDS) 104, according to one or more embodiments described and discussed herein. The flexible cover lens assembly 102 contains a glass layer 110, an impact absorption layer (IAL) 120 disposed on the glass layer 110, a moisture barrier layer 130 disposed on the impact absorption layer 120, a substrate 140 disposed on the moisture barrier layer 130, a first or wet hardcoat (HC) layer 150 disposed on the substrate 140, an adhesion promotion layer (APL) 160 disposed on the wet hardcoat layer 150, an anti-reflectance (ARF) layer 170 disposed on the adhesion promotion layer 160, a second or dry hardcoat (HC) layer 180 disposed on the anti-reflectance layer 170, and an anti-fingerprint coating (AFC) layer 190 disposed on the dry hardcoat layer 180. In one or more examples, the wet hardcoat layer 150 can have a pencil hardness in a range from about 2H to about 9H, a nano-indentation hardness in a range from about 0.4 GPa to about 1.5 GPa, and a porosity of about 6% to about 10%, and the dry hardcoat layer 180 can have a pencil hardness in a range from about 2H to about 9H, a nano-indentation hardness in a range from about 1 GPa to about 5 GPa, and a porosity of about 1% to about 7%.

Flexible Display Structure (FDS) and Glass Layer

The FDS 104 is a flexible display structure or flexible display stack which can be or include one or more light emitting diode (LED) displays, one or more organic light emitting diode (OLED) displays, one or more liquid crystal displays (LCDs), one or more quantum dot (QD) displays, as well as other type of displays. The FDS 104 can be or include one or more flexible displays and/or one or more rigid displays. The FDS 104 can be or include other types of devices and can be contained within or a part of a monitor, a display, a screen, a television, a phone (e.g., mobile phone, smart phone, or cellular phone), a computer or laptop, a tablet, a watch, or other electronic device. In some examples, the FDS 104 can be or include a foldable screen or foldable display on a foldable or flip phone. In other examples, the FDS 104 can be or include a foldable screen or foldable display on a foldable laptop computer or foldable tablet.

In one or more embodiments, the FDS 104 may or may not have a display glass layer as an upper surface. In some examples, the FDS 104 does not have a display glass layer as the upper surface but instead includes the glass layer 110. In other examples, the FDS 104 does have a display glass layer (not shown) as the upper surface and the glass layer 110 is omitted in the flexible cover lens assembly 102 or other flexible cover lens assemblies described and discussed herein. In some examples, the FDS 104 does have a display glass layer (not shown) as the upper surface and the glass layer 110 is disposed on the display glass layer of the FDS 104 in the flexible cover lens assembly 102 or other flexible cover lens assemblies described and discussed herein.

The glass layer 110 is or includes one or more layers containing glass which are optically clear or transparent. In some examples, the glass layer 110 contains one or more ultra-thin glass layers. The glass layer 110 has a thickness of about 5 μm, about 10 μm, about 15 μm, about 20 μm, or about 30 μm to about 40 μm, about 50 μm, about 60 μm, about 70 μm, about 80 μm, about 90 μm, about 100 μm, about 120 μm, about 150 μm, about 200 μm, or greater. For example, the glass layer 110 has a thickness of about 5 μm to about 200 μm, about 10 μm to about 200 μm, about 20 μm to about 200 μm, about 50 μm to about 200 μm, about 80 μm to about 200 μm, about 100 μm to about 200 μm, about 150 μm to about 200 μm, about 5 μm to about 100 μm, about 10 μm to about 100 μm, about 20 μm to about 100 μm, about 50 μm to about 100 μm, about 80 μm to about 100 μm, about 100 μm to about 120 μm, about 5 μm to about 80 μm, about 10 μm to about 80 μm, about 20 μm to about 80 μm, or about 50 μm to about 80 μm.

Impact Adsorption Layer (IAL)

The impact absorption layer 120 can be or include one or more layers which are bendable, flexible, and/or foldable and used to absorb shock or impact. The impact absorption layer 120 contains one or more materials which can be or include ether urethane, ester urethane, aliphatic urethane, aliphatic polyurethane, aliphatic polyester urethane, polysulfide thermoset, poly amide, copolymers thereof, elastomers thereof, or any combination thereof. In some examples, the impact absorption layer 120 can be deposited or otherwise formed by solution processing and include using techniques such as bar-coater, slot-die, or other methods. In one or more embodiments, the impact absorption layer 120 can be formed, treated, and/or otherwise processed on a sheet-to-sheet processing system or a roll-to-roll processing system. For example, the impact absorption layer 120 can deposited, coated, or otherwise formed on an underlying surface, layer, or device by one or more sheet-to-sheet or roll-to-roll process techniques.

The impact absorption layer 120 has an optical transmission in the visible range within a range from about 82%, about 85%, about 86%, about 88%, or about 90% to about 92%, about 94%, about 95%, about 96%, about 97%, about 98%, or about 99%. For example, the impact absorption layer 120 has an optical transmission in the visible range within a range from about 82% to about 99%, about 85% to about 99%, about 88% to about 99%, about 90% to about 99%, about 92% to about 99%, about 95% to about 99%, about 97% to about 99%, about 82% to about 98%, about 85% to about 98%, about 88% to about 98%, about 90% to about 98%, about 92% to about 98%, about 95% to about 98%, about 97% to about 98%, about 82% to about 96%, about 85% to about 96%, about 88% to about 96%, about 90% to about 96%, about 92% to about 96%, or about 95% to about 96%.

The impact absorption layer 120 has a thickness of about 0.5 μm, about 1 μm, about 2 μm, about 5 μm, about 10 μm, about 15 μm, about 20 μm, or about 25 μm to about 30 μm, about 40 μm, about 50 μm, about 60 μm, about 70 μm, about 80 μm, about 90 μm, about 100 μm, about 120 μm, about 150 μm, about 200 μm, or greater. For example, the impact absorption layer 120 has a thickness of about 0.5 μm to about 200 μm, about 1 μm to about 200 μm, about 5 μm to about 200 μm, about 10 μm to about 200 μm, about 20 μm to about 200 μm, about 35 μm to about 200 μm, about 50 μm to about 200 μm, about 80 μm to about 200 μm, about 100 μm to about 200 μm, about 150 μm to about 200 μm, about 0.5 μm to about 150 μm, about 1 μm to about 150 μm, about 5 μm to about 150 μm, about 10 μm to about 150 μm, about 20 μm to about 150 μm, about 35 μm to about 150 μm, about 50 μm to about 150 μm, about 80 μm to about 150 μm, about 100

μm to about 150 μm, about 125 μm to about 150 μm, about 0.5 μm to about 100 μm, about 1 μm to about 100 μm, about 5 μm to about 100 μm, about 10 μm to about 100 μm, about 20 μm to about 100 μm, about 35 μm to about 100 μm, about 50 μm to about 100 μm, or about 80 μm to about 100 μm.

In one or more examples, the impact absorption layer 120 can include an elastomer layer with a thickness of less than 100 μm, such as about 75 μm or less. In some examples, the impact absorption layer 120 can be slot die coated or cast.

Moisture Barrier Layer (MBL)

The moisture barrier layer 130 can be one or more films, coatings, or other layers which have intrinsic moisture or water barrier properties and are bendable, flexible, and/or foldable. In some embodiments, the moisture barrier layer 130 contains one or more one or more layers, such as a moisture and/or water vapor barrier layer, a high surface energy layer (e.g., hydrophilic properties), a planarization layer, an encapsulation layer, portions of layers thereof, or combinations thereof. In one or more embodiments, the moisture barrier layer 130 contains one or more materials which can be or include silicon oxide, silicon nitride, silicon oxynitride, a dopant thereof, or any combination thereof.

In some embodiments, the moisture barrier layer 130 contains a single layer, but can also include multiples layers, such as 2, 3, 4, 5, 6, 7, 8, 9, or more sublayers. For example, the moisture barrier layer 130 can include a plurality of sublayers contained therein, such as from about 2 sublayers to about 5 sublayers. In one or more examples, the moisture barrier layer 130 contains a film stack having three or more sublayers, such as a first sublayer, a second sublayer, and a third sublayer—where the second sublayer is disposed between the first and second sublayers. In one example, the film stack is a SiN/SiO/SiN stack where the first sublayer can be or include silicon nitride, the second sublayer can be or include silicon oxide, and the third sublayer contains silicon nitride. The moisture barrier layer 130 is deposited or otherwise produced from one or more vapor deposition processes which can be or include physical vapor deposition (PVD), chemical vapor deposition (CVD), plasma-enhanced CVD (PE-CVD), high-density plasma CVD (HDP-CVD), atomic layer deposition (ALD), plasma-enhanced ALD (PE-ALD), other vacuum or vapor deposition processes, or any combination thereof. In one or more embodiments, the moisture barrier layer 130 can be formed, treated, and/or otherwise processed on a sheet-to-sheet processing system or a roll-to-roll processing system. For example, the moisture barrier layer 130 can deposited, coated, or otherwise formed on an underlying surface, layer, or device by one or more sheet-to-sheet or roll-to-roll process techniques.

The moisture barrier layer 130 has a thickness of about 5 nm, about 10 nm, about 20 nm, about 30 nm, about 40 nm, or about 50 nm to about 60 nm, about 80 nm, about 100 nm, about 150 nm, about 200 nm, about 250 nm, about 300 nm, about 400 nm, about 500 nm, about 600 nm, about 700 nm, or greater. For example, the moisture barrier layer 130 has a thickness of about 5 nm to about 700 nm, about 5 nm to about 500 nm, about 5 nm to about 400 nm, about 5 nm to about 350 nm, about 5 nm to about 300 nm, about 5 nm to about 250 nm, about 5 nm to about 200 nm, about 5 nm to about 150 nm, about 5 nm to about 100 nm, about 5 nm to about 80 nm, about 5 nm to about 50 nm, about 5 nm to about 30 nm, about 20 nm to about 500 nm, about 20 nm to about 400 nm, about 20 nm to about 350 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 30 nm, about 50 nm to about 500 nm, about 50 nm to about 400 nm, about 50 nm to about 350 nm, about 50 nm to about 300 nm, about 50 nm to about 250 nm, about 50 nm to about 200 nm, about 50 nm to about 150 nm, about 50 nm to about 100 nm, or about 50 nm to about 80 nm.

The moisture barrier layer 130 has a water vapor transport rate (WVTR) of about $1\times10^{-6}$ g/m²/day, about $1\times10^{-5}$ g/m²/day, about $1\times10^{-4}$ g/m²/day, or about $1\times10^{-3}$ g/m²/day to about $1\times10^{-2}$ g/m²/day, about 0.1 g/m²/day, about 0.5 g/m²/day, about 1 g/m²/day, about 5 g/m²/day, or about 10 g/m²/day. For example, the moisture barrier layer 130 has a WVTR within a range from about $1\times10^{-6}$ g/m²/day to about 10 g/m²/day, about $1\times10^{-5}$ g/m²/day to about 10 g/m²/day, about $1\times10^{-4}$ g/m²/day to about 10 g/m²/day, about $1\times10^{-3}$ g/m²/day to about 10 g/m²/day, about $1\times10^{-2}$ g/m²/day to about 10 g/m²/day, about 0.1 g/m²/day to about 10 g/m²/day, about 0.5 g/m²/day to about 10 g/m²/day, about 1 g/m²/day to about 10 g/m²/day, about $1\times10^{-6}$ g/m²/day to about 1 g/m²/day, about $1\times10^{-5}$ g/m²/day to about 1 g/m²/day, about $1\times10^{-4}$ g/m²/day to about 1 g/m²/day, about $1\times10^{-3}$ g/m²/day to about 1 g/m²/day, about $1\times10^{-2}$ g/m²/day to about 1 g/m²/day, about 0.1 g/m²/day to about 1 g/m²/day, or about 0.5 g/m²/day to about 1 g/m²/day.

The moisture barrier layer 130 has an optical transmission in the visible range within a range from about 82%, about 85%, about 86%, about 88%, or about 90% to about 92%, about 94%, about 95%, about 96%, about 97%, about 98%, or about 99%. For example, the moisture barrier layer 130 has an optical transmission in the visible range within a range from about 82% to about 99%, about 85% to about 99%, about 88% to about 99%, about 90% to about 99%, about 92% to about 99%, about 95% to about 99%, about 97% to about 99%, about 82% to about 98%, about 85% to about 98%, about 88% to about 98%, about 90% to about 98%, about 92% to about 98%, about 95% to about 98%, about 97% to about 98%, about 82% to about 96%, about 85% to about 96%, about 88% to about 96%, about 90% to about 96%, about 92% to about 96%, or about 95% to about 96%.

Substrate

The substrate 140 can be or include one or more flexible plastic or polymeric substrates. The substrate 140 can be transparent and/or colorless. The substrate 140 contains one or more materials which can be or include one or more of polyethylene terephthalates (PET), triacetylcelluloses, polycarbonates, polyimides, colorless polyimides (CPI), polyamides, polysulfides, polymethacrylic acid methyl esters, polyether ether ketones, polyaryletherketones, transparent conductive polyesters, copolymers thereof, elastomers thereof, or any combination thereof.

The substrate 140 has a thickness of about 1 μm, about 2 μm, about 5 μm, about 10 μm, about 15 μm, about 20 μm, or about 25 μm to about 30 μm, about 40 μm, about 50 μm, about 60 μm, about 70 μm, about 80 μm, about 90 μm, about 100 μm, about 120 μm, about 150 μm, about 200 μm, or greater. For example, the substrate 140 has a thickness of about 5 μm to about 200 μm, about 10 μm to about 200 μm, about 20 μm to about 200 μm, about 50 μm to about 200 μm, about 80 μm to about 200 μm, about 5 μm to about 100 μm, about 10 μm to about 100 μm, about 20 μm to about 100 μm, about 30 μm to about 100 μm, about 50 μm to about 100 μm, about 80 μm to about 100 μm, about 5 μm to about 80 μm, about 10 μm to about 80 μm, about 20 μm to about 80 μm, about 30 μm to about 80 μm, about 50 μm to about 80 μm, about 60 μm to about 80 μm, about 5 μm to about 50 μm, about 10 μm to about 50 μm, about 20 μm to about 50 μm, or about 30 μm to about 50 μm.

First or Wet Hardcoat (wHC) Layer

In one or more embodiments, the wet hardcoat layer 150 can be or include one or more wet hardcoat layers. The wet hardcoat layer 150 can be or include one or more acrylates, one or more solgels, one or more siloxanes, one or more copolymers thereof, one or more elastomers thereof, or any combination thereof. In one or more examples, the wet hardcoat layer 150 contains or is an acrylate which can be or include a radiation curable acrylate, aliphatic urethane acrylate, a copolymer thereof, an elastomer thereof, or any combination thereof. For example, the wet hardcoat layer 150 contains or is the thermally-cured acrylate and/or a UV-cured acrylate.

The wet hardcoat layer 150 obtains the "wet" portion of its name due to being deposited or otherwise formed by a type of liquid deposition process which uses a liquid-type media or starting material. Once deposited or otherwise formed, the wet hardcoat layer 150 is a solid layer which is completely dry or substantially dry. The wet hardcoat layer 150 can be produced from a gel, a spin-coating, a solution, a suspension, or any combination thereof. In some examples, the gel, solution, or suspension contains one or more solvents, in other examples, the gel, solution, or suspension does not contain a solvent, such as being completely or substantially free of a solvent. In one or more embodiments, the wet hardcoat layer 150 can be formed, treated, and/or otherwise processed on a sheet-to-sheet processing system or a roll-to-roll processing system. For example, the wet hardcoat layer 150 can deposited, coated, or otherwise formed on an underlying surface, layer, or device by one or more sheet-to-sheet or roll-to-roll process techniques.

In one or more embodiments, the wet hardcoat layer 150 contains a plurality of inorganic nanoparticles or other particulate displaced or otherwise disposed within an organic matrix or an inorganic matrix. In some examples, the wet hardcoat layer 150 contains thermally-cured or UV-cured acrylates or sol-gels with organic matrix interspersed or distributed with inorganic nano-particles, embedded as fillers or covalently bonded to the organic matrix. Exemplary inorganic particles can be or include silica, alumina, titanium oxide, zirconium oxide, hafnium oxide, or any combination thereof. The inorganic particles can be nanoparticles and have a particle size of about 1 nm to about 500 nm, about 5 nm to about 100 nm, or about 10 nm to about 50 nm. The wet hardcoat layer 150 can include about 40 wt %, about 45 wt %, or about 50 wt % to about 55 wt %, about 60 wt %, about 65 wt %, about 70 wt %, or about 75 wt % of the inorganic particles or other particulate. For example, the wet hardcoat layer 150 can include about 40 wt % to about 75 wt %, about 40 wt % to about 70 wt %, or about 45 wt % to about 65 wt % of the inorganic particles or other particulate.

The wet hardcoat layer 150 has a refractive index of about 1.40, about 1.42, about 1.43, about 1.45, or about 1.46 to about 1.48, about 1.50, about 1.51, about 1.52, about 1.54, about 1.55, or greater. For example, the wet hardcoat layer 150 has a refractive index of about 1.40 to about 1.55, about 1.40 to about 1.53, about 1.40 to about 1.51, about 1.40 to about 1.50, about 1.40 to about 1.48, about 1.40 to about 1.46, about 1.40 to about 1.45, about 1.40 to about 1.43, about 1.43 to about 1.55, about 1.43 to about 1.53, about 1.43 to about 1.51, about 1.43 to about 1.50, about 1.43 to about 1.48, about 1.43 to about 1.46, about 1.43 to about 1.45, about 1.45 to about 1.55, about 1.45 to about 1.53, about 1.45 to about 1.51, about 1.45 to about 1.50, about 1.45 to about 1.48, or about 1.45 to about 1.46. In some examples, the wet hardcoat layer 150 has a refractive index of about 1.40 to about 1.55, or about 1.43 to about 1.51.

The wet hardcoat layer 150 can have a thickness of about 0.1 µm, about 0.2 µm, about 0.5 µm, about 0.6 µm, about 0.8 µm, about 1 µm, about 1.2 µm, about 1.5 µm, about 1.8 µm, about 2 µm, about 3 µm, about 5 µm, about 10 µm, about 15 µm, or about 20 µm to about 25 µm, about 30 µm, about 35 µm, about 40 µm, about 50 µm, or thicker. For example, the wet hardcoat layer 150 can have a thickness of about 0.1 µm to about 50 µm, about 0.1 µm to about 40 µm, about 0.1 µm to about 35 µm, about 0.1 µm to about 30 µm, about 0.1 µm to about 25 µm, about 0.1 µm to about 20 µm, about 0.1 µm to about 15 µm, about 0.1 µm to about 10 µm, about 0.1 µm to about 5 µm, about 0.1 µm to about 2 µm, about 0.1 µm to about 1 µm, about 0.5 µm to about 50 µm, about 0.5 µm to about 40 µm, about 0.5 µm to about 35 µm, about 0.5 µm to about 30 µm, about 0.5 µm to about 25 µm, about 0.5 µm to about 20 µm, about 0.5 µm to about 10 µm, about 0.5 µm to about 5 µm, about 0.5 µm to about 2 µm, about 1 µm to about 50 µm, about 1 µm to about 40 µm, about 1 µm to about 35 µm, about 1 µm to about 30 µm, about 1 µm to about 25 µm, about 1 µm to about 20 µm, about 1 µm to about 10 µm, about 1 µm to about 5 µm, about 1 µm to about 3 µm, about 5 µm to about 50 µm, about 5 µm to about 40 µm, about 5 µm to about 35 µm, about 5 µm to about 30 µm, about 5 µm to about 25 µm, about 5 µm to about 20 µm, about 10 µm to about 50 µm, about 10 µm to about 40 µm, about 10 µm to about 35 µm, about 10 µm to about 30 µm, about 10 µm to about 25 µm, or about 10 µm to about 20 µm. In one or more examples, the wet hardcoat layer 150 has a thickness in a range from about 0.5 µm to about 40 µm.

The wet hardcoat layer 150 has a porosity of about 5%, about 6%, about 6.5%, about 7%, or about 7.5% to about 8%, about 8.5%, about 9%, about 9.5%, about 10%, about 11%, about 12%, or about 15%, as measured using Ellipsometry Porosity. For example, the wet hardcoat layer 150 has a porosity of about 5% to about 12%, about 6% to about 12%, about 6% to about 11%, about 6% to about 10.5%, about 6% to about 10%, about 6% to about 9.5%, about 6% to about 9%, about 6% to about 8.5%, about 6% to about 8%, about 6% to about 7.5%, about 6% to about 7%, about 7% to about 12%, about 7% to about 11%, about 7% to about 10.5%, about 7% to about 10%, about 7% to about 9.5%, about 7% to about 9%, about 7% to about 8.5%, about 7% to about 8%, about 7% to about 7.5%, about 8% to about 12%, about 8% to about 11%, about 8% to about 10.5%, about 8% to about 10%, about 8% to about 9.5%, about 8% to about 9%, or about 8% to about 8.5%, as measured using Ellipsometry Porosity.

The wet hardcoat layer 150 can have a pencil hardness of about 2H, about 3H, about 4H, about 5H, or about 6H to about 7H, about 8H, or about 9H, based on the pencil hardness scale. For example, the wet hardcoat layer 150 can have a pencil hardness of about 2H to about 9H, about 3H to about 9H, about 4H to about 9H, about 5H to about 9H, about 6H to about 9H, about 7H to about 9H, about 2H to about 8H, about 3H to about 8H, about 4H to about 8H, about 5H to about 8H, about 6H to about 8H, about 7H to about 8H, about 2H to about 7H, about 3H to about 7H, about 4H to about 7H, about 5H to about 7H, about 6H to about 7H, about 6H to about 9H, about 7H to about 9H, about 8H to about 9H, about 6H to about 8H, or about 7H to about 8H, based on the pencil hardness scale. In one or more examples, the wet hardcoat layer 150 has a pencil hardness from about 6H to about 9H.

In one or more embodiments, the wet hardcoat layer 150 can have a nano-indentation hardness across a thickness of the wet hardcoat layer 150 within a range from about 0.1 GPa, about 0.5 GPa, about 0.8 GPa, about 1 GPa, about 1.2 GPa, about 1.5 GPa, or about 1.8 GPa to about 2 GPa, about 2.2 GPa, about 2.5 GPa, about 2.8 GPa, about 3 GPa, about 3.5 GPa, about 4 GPa, about 4.5 GPa, about 5 GPa, or greater, as measured by nano-indentation technique, which follows the Oliver-Pharr Indentation methods for mechanical properties characterization of materials. In some examples, the wet hardcoat layer 150 can have a nano-indentation hardness across a thickness of the wet hardcoat layer 150 within a range from about 0.1 GPa to about 5 GPa, about 0.5 GPa to about 5 GPa, about 1 GPa to about 5 GPa, about 1.5 GPa to about 5 GPa, about 2 GPa to about 5 GPa, about 2.5 GPa to about 5 GPa, about 3 GPa to about 5 GPa, about 3.5 GPa to about 5 GPa, about 4 GPa to about 5 GPa, about 4.5 GPa to about 5 GPa, about 1.5 GPa to about 5 GPa, about 1.5 GPa to about 4.5 GPa, about 1.5 GPa to about 4 GPa, about 1.5 GPa to about 3.5 GPa, about 1.5 GPa to about 3 GPa, about 0.1 GPa to about 4 GPa, about 0.5 GPa to about 4 GPa, about 1 GPa to about 4 GPa, about 1.5 GPa to about 4 GPa, about 2 GPa to about 4 GPa, about 2.5 GPa to about 4 GPa, about 3 GPa to about 4 GPa, about 3.5 GPa to about 4 GPa, about 0.1 GPa to about 3 GPa, about 0.5 GPa to about 3 GPa, about 1 GPa to about 3 GPa, about 1.5 GPa to about 3 GPa, about 2 GPa to about 3 GPa, about 2.5 GPa to about 3 GPa, or about 1 GPa to about 2 GPa, as measured by nano-indentation technique.

The wet hardcoat layer 150 has a bending inside radius of about 1 mm to about 5 mm, a bending outside radius of about 5 mm to about 20 mm, a transmittance of about 85% to about 98%, about 88% to about 95%, or about 90% to about 92%, and a thermal resistance of about −20° C. to about 80° C. In one or more examples, the wet hardcoat layer 150 can be cured using ultraviolet radiation, a thermal curing process, an electron-beam process and/or vacuum deposition process with plasma. The wet hardcoat layer 150 can have a transmission of about 90% to about 99.99% ASTM D1003, a haze of less than 1% ASTM D10003, and a sandpaper abrasion of less than 0.5% ASTM D1044.

Adhesion Promotion Layer (APL)

The adhesion promotion layer 160 can be or include a single layer or can include a plurality of layers. In embodiments were the adhesion promotion layer 160 contains two or more layers, the adhesion promotion layer 160 can have a consistent composition across the thickness of the layer or can have a gradient composition across the thickness. A gradient composition across the thickness provides gradient properties (e.g., hardness, elastic modulus, or carbon concentration) across the thickness of the adhesion promotion layer 160. In one or more examples, the hardness value of the adhesion promotion layer 160 is about 10% to about 15% of the elastic modulus value of the adhesion promotion layer 160.

The adhesion promotion layer 160 contains one or more materials which can be or include silicon oxide, silicon carbide, silicon oxycarbide, silicon nitride, silicon oxynitride, silicon oxycarbide nitride, a dopant thereof, or any combination thereof. The adhesion promotion layer 160 can be deposited or otherwise produced by one or more vapor deposition processes which can be or include PVD, sputtering, CVD, PE-CVD, HDP-CVD, ALD, PE-ALD, other vacuum or vapor deposition processes, or any combination thereof. In one or more embodiments, the adhesion promotion layer 160 can be formed, treated, and/or otherwise processed on a sheet-to-sheet processing system or a roll-to-roll processing system. For example, the adhesion promotion layer 160 can deposited, coated, or otherwise formed on an underlying surface, layer, or device by one or more sheet-to-sheet or roll-to-roll process techniques.

In one or more examples, the adhesion promotion layer 160 can be deposited or otherwise produced from one or more silicon precursors and one or more oxidizing agents during a vapor deposition process. The ratio of the silicon precursor and the oxidizing agent can be adjusted during the vapor deposition process after depositing each sublayer of a stack. These adjustments are used to control the desired gradient properties. The silicon precursor can be or include one or more alkylsilanes, alkoxysilanes, alkylsiloxanes, alkylsilazanes, or any combination thereof. The oxidizing agent can be or include oxygen, ozone, plasma oxygen, atomic oxygen, water or vapor, nitrous oxide, peroxide, or any combination thereof.

In one or more examples, the adhesion promotion layer 160 can be a non-gradient layer or film. In other examples, the adhesion promotion layer 160 can be a gradient layer or film which contains 2 or more sublayers therein. For example, the adhesion promotion layer 160 can contain 2, 3, 4, or 5 sublayers to 6, 7, 8, 9, 10, or more sublayers. In some examples, the adhesion promotion layer 160 can contain 2 sublayers to 10 sublayers, 2 sublayers to 8 sublayers, 2 sublayers to 7 sublayers, 2 sublayers to 6 sublayers, 2 sublayers to 5 sublayers, 2 sublayers to 4 sublayers, 2 sublayers to 3 sublayers, 3 sublayers to 10 sublayers, 3 sublayers to 8 sublayers, 3 sublayers to 7 sublayers, 3 sublayers to 6 sublayers, 3 sublayers to 5 sublayers, 3 sublayers to 4 sublayers, 4 sublayers to 10 sublayers, 4 sublayers to 8 sublayers, 4 sublayers to 7 sublayers, 4 sublayers to 6 sublayers, or 4 sublayers to 5 sublayers.

In some embodiments, the adhesion promotion layer 160 has a gradient of carbon concentration across a thickness of the adhesion promotion layer 160. The adhesion promotion layer 160 contains a plurality of sublayers contained therein. The adhesion promotion layer 160 can include 2, 3, 4, or 5 sublayers to 6, 7, 8, 9, 10, 12, or more sublayers. In some examples, the plurality of sublayers contains a gradient of carbon concentration across a thickness of the adhesion promotion layer 160, and/or a gradient of hardness across a thickness of the adhesion promotion layer 160, and/or a gradient of elastic modulus across a thickness of the adhesion promotion layer 160.

In one or more examples, the adhesion promotion layer 160 contains five sublayers of varying hardness (H) to produce gradient across the thickness of the adhesion promotion layer 160. In one or more examples, the five sublayers includes: $1^{st}$ layer: H=about 0.5-0.9 GPa; $2^{nd}$ layer: H=about 0.8-1.3 GPa; $3^{rd}$ layer H=about 1.2-2.4 GPa; $4^{th}$ layer H=about 2.0-2.8 GPa; and $5^{th}$ layer H=about 2.0-2.9 GPa. In other examples, the five sublayers includes: $1^{st}$ layer: H=about 0.7-0.9 GPa; $2^{nd}$ layer: H=about 1.1-1.3 GPa; $3^{rd}$ layer H=about 1.9-2.4 GPa (another example H=about 2.2-2.4 GPa); $4^{th}$ layer H=about 2.6-2.8 GPa; and $5^{th}$ layer H=about 2.7-2.9 GPa.

In one or more embodiments, each of the plurality of sublayers can independently have a nano-indentation hardness across a thickness of the adhesion promotion layer 160 within a range from about 0.1 GPa, about 0.5 GPa, about 0.8 GPa, or about 1 GPa to about 1.5 GPa, about 2 GPa, about 2.5 GPa, about 3 GPa, about 3.5 GPa, about 4 GPa, about 4.5 GPa, about 5 GPa, or greater, as measured by nano-indentation technique, which follows the Oliver-Pharr Indentation methods for mechanical properties characterization of materials. In some examples, each of the plurality of sublayers can independently have a nano-indentation hardness across a thickness of the adhesion promotion layer 160 within a range from about 0.1 GPa to about 5 GPa, about 0.1 GPa to about 4 GPa, about 0.1 GPa to about 3 GPa, about 0.1 GPa to about 2 GPa, about 0.1 GPa to about 1 GPa, about 0.1 GPa to about 5 GPa, about 0.5 GPa to about 4.5 GPa, about 0.5 GPa to about 4 GPa, about 0.5 GPa to about 3.5 GPa, about 0.5 GPa to about 3 GPa, about 0.5 GPa to about 2.5 GPa, about 0.5 GPa to about 2 GPa, about 0.5 GPa to about 1.5 GPa, about 0.5 GPa to about 1 GPa, about 1 GPa to about 5 GPa, about 1 GPa to about 4 GPa, about 1 GPa to about 3 GPa, or about 1 GPa to about 2 GPa, as measured by nano-indentation technique.

The adhesion promotion layer 160 has a refractive index of about 1.35, about 1.38, about 1.40, about 1.42, about 1.43, about 1.45, or about 1.46 to about 1.48, about 1.50, about 1.51, about 1.52, about 1.54, about 1.55, or greater. For example, the adhesion promotion layer 160 has a refractive index of about 1.40 to about 1.55, about 1.40 to about 1.53, about 1.40 to about 1.51, about 1.40 to about 1.50, about 1.40 to about 1.48, about 1.40 to about 1.46, about 1.40 to about 1.45, about 1.40 to about 1.43, about 1.43 to about 1.55, about 1.43 to about 1.53, about 1.43 to about 1.51, about 1.43 to about 1.50, about 1.43 to about 1.48, about 1.43 to about 1.46, about 1.43 to about 1.45, about 1.45 to about 1.55, about 1.45 to about 1.53, about 1.45 to about 1.51, about 1.45 to about 1.50, about 1.45 to about 1.48, or about 1.45 to about 1.46. In some examples, the adhesion promotion layer 160 has a refractive index of about 1.40 to about 1.55, or about 1.43 to about 1.51.

The adhesion promotion layer 160 has a thickness of about 0.01 μm, about 0.02 μm, about 0.04 μm, about 0.08 μm, about 0.1 μm, about 0.2 μm, about 0.5 μm, about 0.8 μm, or about 1 μm to about 1.5 μm, about 2 μm, about 5 μm, about 8 μm, about 10 μm, about 15 μm, about 20 μm, about 25 μm, about 30 μm, about 35 μm, about 40 μm, about 50 μm, or greater. The adhesion promotion layer 160 has a thickness in a range from about 0.01 μm to about 50 μm, about 0.04 μm to about 50 μm, about 0.04 μm to about 30 μm, about 0.04 μm to about 20 μm, about 0.04 μm to about 10 μm, about 0.04 μm to about 8 μm, about 0.04 μm to about 5 μm, about 0.04 μm to about 1 μm, about 0.04 μm to about 0.1 μm, about 0.1 μm to about 30 μm, about 0.1 μm to about 20 μm, about 0.1 μm to about 10 μm, about 0.1 μm to about 8 μm, about 0.1 μm to about 5 μm, about 0.1 μm to about 1 μm, about 1 μm to about 30 μm, about 1 μm to about 20 μm, about 1 μm to about 10 μm, about 1 μm to about 8 μm, about 1 μm to about 5 μm, or about 1 μm to about 3 μm.

FIG. 24 depicts a schematic, cross-sectional view of an adhesion promotion layer (APL) 260 containing a plurality of sublayers 210, 212, 214, 216, 218, 220, 222, 224, 226, and 228, according to one or more embodiments described and discussed herein. In one or more embodiments, the adhesion promotion layer 260 can be substituted for the adhesion promotion layer 160 in any embodiment described and discussed herein. Although the adhesion promotion layer 260 is shown with ten sublayers (sublayers 210, 212, 214, 216, 218, 220, 222, 224, 226, and 228)—the adhesion promotion layer 260 can include 2, 3, 4, or 5 sublayers to 6, 7, 8, 9, 10, 12, or more sublayers. In some examples, the plurality of sublayers contains a gradient of carbon concentration across a thickness of the adhesion promotion layer 260 and/or a gradient of hardness across a thickness of the adhesion promotion layer 260. The carbon concentration can vary across the thickness of the adhesion promotion layer 260 by decreasing the carbon content from the bottom or lowest layer to the top or highest layer within the plurality of sublayers.

In some examples of the adhesion promotion layer 260, the carbon content of the bottom or lowest layer can be about 20 atomic percent (at %) to about 65 at % and the carbon content of the top or highest layer can be about 5 at % to about 15 at %. In one or more examples of the adhesion promotion layer 260 containing five sublayers (Layers 1-5 from bottom to top, respectively), the plurality of sublayers include the following carbon concentrations: Layer 1 about 20 at % to about 65 at % (another example about 20 at % to about 43 at %); Layer 2 about 15 at % to about 35 at %; Layer 3 about 10 at % to about 30 at %; Layer 4 about 7 at % to about 20 at %; and Layer 5 about 5 at % to about 15 at %. The carbon content can be measured using X-ray Photoelectron Spectroscopy (XPS) elemental analysis technique.

Anti-Reflectance (ARF) Layer

The anti-reflectance layer 170 contains one or more layers for reducing or prohibiting light reflection. The anti-reflectance layer 170 contains one or more materials which can be or include silicon nitride, silicon oxynitride, silicon carbide nitride, silicon oxycarbide nitride, a dopant thereof, or any combination thereof. The anti-reflectance layer 170 can be deposited or otherwise produced from one or more vapor deposition processes. For example, the anti-reflectance layer 170 is deposited or produced from a vapor deposition process which can be or include sputtering, PVD, CVD, PE-CVD, HDP-CVD, ALD, PE-ALD, other vacuum or vapor deposition processes, or any combination thereof. In one or more examples, the anti-reflectance layer 170 contains silicon nitride deposited by one or more vapor deposition processes. In one or more embodiments, the anti-reflectance layer 170 can be formed, treated, and/or otherwise processed on a sheet-to-sheet processing system or a roll-to-roll processing system. For example, the anti-reflectance layer 170 can deposited, coated, or otherwise formed on an underlying surface, layer, or device by one or more sheet-to-sheet or roll-to-roll process techniques.

In some examples, the anti-reflectance layer 170 is formed or otherwise deposited by a vapor deposition process using one or more of the following precursors: one or more organic polymer precursors (liquid and/or gas), hexamethyldisiloxane (HMDSO), ppHMDSO, tetramethyl cyclotetrasiloxane (TOMCAT), hexamethyldisilazane (HMDSN), tetraethyl orthosilicate (TEOS), silane, disilane, trisilane, or any combination thereof. In other examples, the anti-reflectance layer 170 is formed or otherwise deposited by a sputtering process using silica or quartz.

The anti-reflectance layer 170 has a refractive index of about 1.5, about 1.7, about 1.8, about 1.9, or about 2.0 to about 2.1, about 2.2, about 2.3, about 2.4, or about 2.5. For example, the anti-reflectance layer 170 has a refractive index of about 1.5 to about 2.5, about 1.5 to about 2.3, about 1.5 to about 2.1, about 1.5 to about 2.0, about 1.5 to about 1.8, about 1.5 to about 1.7, about 1.7 to about 2.5, about 1.7 to about 2.3, about 1.7 to about 2.1, about 1.7 to about 2.0, about 1.8 to about 2.5, about 1.8 to about 2.3, about 1.8 to about 2.1, about 1.8 to about 2.0, about 2.0 to about 2.5, or about 2.0 to about 2.3.

The anti-reflectance layer 170 has a thickness of about 0.5 nm, about 1 nm, about 2 nm, about 3 nm, about 4 nm, about 5 nm, about 8 nm, about 10 nm, about 20 nm, about 30 nm, about 40 nm, or about 50 nm to about 60 nm, about 80 nm, about 100 nm, about 120 nm, about 150 nm, about 180 nm, about 200 nm, about 250 nm, or greater. For example, the anti-reflectance layer 170 has a thickness of about 2 nm to about 250 nm, about 2 nm to about 200 nm, about 2 nm to about 150 nm, about 2 nm to about 100 nm, about 2 nm to about 80 nm, about 2 nm to about 50 nm, about 2 nm to about 30 nm, about 2 nm to about 25 nm, about 2 nm to about 20 nm, about 2 nm to about 15 nm, about 2 nm to about 10 nm, about 2 nm to about 8 nm, about 5 nm to about 250 nm, about 5 nm to about 200 nm, about 5 nm to about 150 nm, about 5 nm to about 100 nm, about 5 nm to about 80 nm, about 5 nm to about 50 nm, about 5 nm to about 30 nm, about 5 nm to about 25 nm, about 5 nm to about 20 nm, about 5 nm to about 15 nm, about 5 nm to about 10 nm, about 5 nm to about 8 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 30 nm, about 50 nm to about 250 nm, about 50 nm to about 200 nm, about 50 nm to about 150 nm, about 50 nm to about 100 nm, or about 50 nm to about 80 nm.

The anti-reflectance layer 170 has an optical transmission in the visible range within a range from about 82%, about 85%, about 86%, about 88%, or about 90% to about 92%, about 94%, about 95%, about 96%, about 97%, about 98%, or about 99%. For example, the anti-reflectance layer 170 has an optical transmission in the visible range within a range from about 82% to about 99%, about 85% to about 99%, about 88% to about 99%, about 90% to about 99%, about 92% to about 99%, about 95% to about 99%, about 97% to about 99%, about 82% to about 98%, about 85% to about 98%, about 88% to about 98%, about 90% to about 98%, about 92% to about 98%, about 95% to about 98%, about 97% to about 98%, about 82% to about 96%, about 85% to about 96%, about 88% to about 96%, about 90% to about 96%, about 92% to about 96%, or about 95% to about 96%.

Second or Dry Hardcoat (dHC) Layer

In one or more embodiments, the dry hardcoat layer 180 can be or include one or more dry hardcoat layers. The dry hardcoat layer 180 contains one or more materials which can be or include silicon oxide, silicon carbide, silicon oxycarbide, silicon nitride, silicon oxynitride, silicon oxycarbide nitride, a dopant thereof, or any combination thereof. In some examples of the dry hardcoat layer 180 containing carbon, the carbon content can be from about 1 at %, about 2 at %, about 3 at %, about 4 at %, about 5 at %, or about 6 at % to about 7 at %, about 8 at %, about 10 at %, about 12 at %, about 15 at %, about 18 at %, or about 20 at %. For example, the dry hardcoat layer 180 can have a carbon content of about 1 at % to about 20 at %, about 5 at % to about 15 at %, about 5 at % to about 10 at %, about 8 at % to about 20 at %, or about 8 at % to about 12 at %. The carbon content can be measured using X-ray Photoelectron Spectroscopy (XPS) elemental analysis technique.

The dry hardcoat layer 180 obtains the "dry" portion of its name due to being formed by one or more types of vapor deposition processes. Once deposited or otherwise formed, the dry hardcoat layer 180 is a solid layer which is completely dry or substantially dry. The dry hardcoat layer 180 is deposited, formed, or otherwise produced from a vapor deposition process which can be or include PVD, CVD, PE-CVD, HDP-CVD, ALD, PE-ALD, other vacuum or vapor deposition processes, or any combination thereof. In some examples, the dry hardcoat layer 180 is produced, deposited coated, or otherwise formed by a vacuum processing, atmospheric processing, solution processing, or other deposition or coating techniques, and then optionally treated or cured with a thermal and/or UV exposure. In one or more embodiments, the dry hardcoat layer 180 can be formed, treated, and/or otherwise processed on a sheet-to-sheet processing system or a roll-to-roll processing system.

For example, the dry hardcoat layer 180 can deposited, coated, or otherwise formed on an underlying surface, layer, or device by one or more sheet-to-sheet or roll-to-roll process techniques.

The dry hardcoat layer 180 has a refractive index of about 1.40, about 1.42, about 1.43, about 1.45, or about 1.46 to about 1.48, about 1.50, about 1.51, about 1.52, about 1.54, about 1.55, or greater. For example, the dry hardcoat layer 180 has a refractive index of about 1.40 to about 1.55, about 1.40 to about 1.53, about 1.40 to about 1.51, about 1.40 to about 1.50, about 1.40 to about 1.48, about 1.40 to about 1.46, about 1.40 to about 1.45, about 1.40 to about 1.43, about 1.43 to about 1.55, about 1.43 to about 1.53, about 1.43 to about 1.51, about 1.43 to about 1.50, about 1.43 to about 1.48, about 1.43 to about 1.46, about 1.43 to about 1.45, about 1.45 to about 1.55, about 1.45 to about 1.53, about 1.45 to about 1.51, about 1.45 to about 1.50, about 1.45 to about 1.48, or about 1.45 to about 1.46. In some examples, the dry hardcoat layer 180 has a refractive index of about 1.42 to about 1.55, or about 1.45 to about 1.51.

The dry hardcoat layer 180 can have a thickness of about 0.1 µm, about 0.2 µm, about 0.5 µm, about 0.6 µm, about 0.8 µm, about 1 µm, about 1.2 µm, about 1.5 µm, about 1.8 µm, about 2 µm, about 3 µm, about 5 µm, about 10 µm, about 15 µm, or about 20 µm to about 25 µm, about 30 µm, about 35 µm, about 40 µm, about 50 µm, or thicker. For example, the dry hardcoat layer 180 can have a thickness of about 0.1 µm to about 50 µm, about 0.1 µm to about 40 µm, about 0.1 µm to about 35 µm, about 0.1 µm to about 30 µm, about 0.1 µm to about 25 µm, about 0.1 µm to about 20 µm, about 0.1 µm to about 15 µm, about 0.1 µm to about 10 µm, about 0.1 µm to about 5 µm, about 0.1 µm to about 2 µm, about 0.1 µm to about 1 µm, about 0.5 µm to about 50 µm, about 0.5 µm to about 40 µm, about 0.5 µm to about 35 µm, about 0.5 µm to about 30 µm, about 0.5 µm to about 25 µm, about 0.5 µm to about 10 µm, about 0.5 µm to about 5 µm, about 0.5 µm to about 2 µm, about 1 µm to about 50 µm, about 1 µm to about 40 µm, about 1 µm to about 35 µm, about 1 µm to about 30 µm, about 1 µm to about 25 µm, about 1 µm to about 20 µm, about 1 µm to about 10 µm, about 1 µm to about 5 µm, about 1 µm to about 3 µm, about 5 µm to about 50 µm, about 5 µm to about 40 µm, about 5 µm to about 35 µm, about 5 µm to about 30 µm, about 5 µm to about 25 µm, about 5 µm to about 20 µm, about 10 µm to about 50 µm, about 10 µm to about 40 µm, about 10 µm to about 35 µm, about 10 µm to about 30 µm, about 10 µm to about 25 µm, or about 10 µm to about 20 µm. In one or more examples, the dry hardcoat layer 180 has a thickness in a range from about 0.5 µm to about 40 µm.

The dry hardcoat layer 180 has a porosity of about 0.5%, about 1%, about 1.5%, about 2%, about 2.5%, or about 3% to about 3.5%, about 4%, about 4.5%, about 5%, about 5.5%, about 6%, about 6.5%, about 7%, or about 8%, as measured using Ellipsometry Porosity. For example, the dry hardcoat layer 180 has a porosity of about 0.5% to about 8%, about 1% to about 8%, about 1% to about 7%, about 1% to about 6.5%, about 1% to about 6%, about 1% to about 5.5%, about 1% to about 5%, about 1% to about 4.5%, about 1% to about 4%, about 1% to about 3.5%, about 1% to about 3%, about 1% to about 2.5%, about 1% to about 2%, about 2% to about 8%, about 2% to about 7%, about 2% to about 6.5%, about 2% to about 6%, about 2% to about 5.5%, about 2% to about 5%, about 2% to about 4.5%, about 2% to about 4%, about 2% to about 3.5%, about 2% to about 3%, about 2% to about 2.5%, about 3% to about 8%, about 3% to about 7%, about 3% to about 6.5%, about 3% to about 6%, about 3% to about 5.5%, about 3% to about 5%, about 3% to about 4.5%, about 3% to about 4%, or about 3% to about 3.5%, as measured using Ellipsometry Porosity.

In one or more examples, the dry hardcoat layer 180 has a porosity of about 0.5% to less than 7% and the wet hardcoat layer 150 has a porosity of 7% to about 12%. In other examples, the dry hardcoat layer 180 has a porosity of about 0.5% to less than 6% and the wet hardcoat layer 150 has a porosity of 6% to about 12%. In some examples, the dry hardcoat layer 180 has a porosity of about 1% to less than 7% and the wet hardcoat layer 150 has a porosity of 7% to about 10%. In other examples, the dry hardcoat layer 180 has a porosity of about 1% to less than 6% and the wet hardcoat layer 150 has a porosity of 6% to about 10%.

The dry hardcoat layer 180 can have a pencil hardness of about 2H, about 3H, about 4H, about 5H, or about 6H to about 7H, about 8H, or about 9H, based on the pencil hardness scale. For example, the dry hardcoat layer 180 can have a pencil hardness of about 2H to about 9H, about 3H to about 9H, about 4H to about 9H, about 5H to about 9H, about 6H to about 9H, about 7H to about 9H, about 2H to about 8H, about 3H to about 8H, about 4H to about 8H, about 5H to about 8H, about 6H to about 8H, about 7H to about 8H, about 2H to about 7H, about 3H to about 7H, about 4H to about 7H, about 5H to about 7H, about 6H to about 7H, about 6H to about 9H, about 7H to about 9H, about 8H to about 9H, about 6H to about 8H, or about 7H to about 8H, based on the pencil hardness scale. In one or more examples, the dry hardcoat layer 180 has a pencil hardness from about 6H to about 9H.

In one or more embodiments, the dry hardcoat layer 180 can have a nano-indentation hardness across a thickness of dry hardcoat layer 180 within a range from about 0.1 GPa, about 0.5 GPa, about 0.8 GPa, about 1 GPa, about 1.2 GPa, about 1.5 GPa, or about 1.8 GPa to about 2 GPa, about 2.2 GPa, about 2.5 GPa, about 2.8 GPa, about 3 GPa, about 3.5 GPa, about 4 GPa, about 4.5 GPa, about 5 GPa, or greater, as measured by nano-indentation technique, which follows the Oliver-Pharr Indentation methods for mechanical properties characterization of materials. In some examples, the dry hardcoat layer 180 can have a nano-indentation hardness across a thickness of the dry hardcoat layer 180 within a range from about 0.1 GPa to about 5 GPa, about 0.5 GPa to about 5 GPa, about 1 GPa to about 5 GPa, about 1.5 GPa to about 5 GPa, about 2 GPa to about 5 GPa, about 2.5 GPa to about 5 GPa, about 3 GPa to about 5 GPa, about 3.5 GPa to about 5 GPa, about 4 GPa to about 5 GPa, about 4.5 GPa to about 5 GPa, about 0.1 GPa to about 4 GPa, about 0.5 GPa to about 4 GPa, about 1 GPa to about 4 GPa, about 1.5 GPa to about 4 GPa, about 2 GPa to about 4 GPa, about 2.5 GPa to about 4 GPa, about 3 GPa to about 4 GPa, about 3.5 GPa to about 4 GPa, about 0.1 GPa to about 3 GPa, about 0.5 GPa to about 3 GPa, about 1 GPa to about 3 GPa, about 1.5 GPa to about 3 GPa, about 2 GPa to about 3 GPa, about 2.5 GPa to about 3 GPa, about 1 GPa to about 2 GPa, about 0.4 GPa to about 3 GPa, about 0.4 GPa to about 1.5 GPa, about 0.4 GPa to about 1.2 GPa, about 0.5 GPa to about 2 GPa, about 0.5 GPa to about 1.2 GPa, or about 0.5 GPa to about 1 GPa, as measured by nano-indentation technique.

The dry hardcoat layer 180 has a bending inside radius of about 1 mm to about 5 mm, a bending outside radius of about 5 mm to about 20 mm, a transmittance of about 85% to about 98%, about 88% to about 95%, or about 90% to about 92%, and a thermal resistance of about −20° C. to about 80° C. In one or more examples, the dry hardcoat layer 180 can be cured using ultraviolet radiation, an electron-beam process and/or vacuum deposition process with plasma. The dry hardcoat layer 180 can have a transmission of about 90% to about 99.99% ASTM D1003, a haze of less than 1% ASTM D10003, and a sandpaper abrasion of less than 0.5% ASTM D1044.

Anti-Fingerprint Coating (AFC) Layer

The anti-fingerprint coating layer 190, also known as an anti-smudge layer, containing one or more layers, films, or coatings and provides an overall upper surface for the flexible cover lens assembly 202 or other flexible cover lens assemblies described and discussed herein. The anti-fingerprint coating layer 190 reduces or prohibits fingerprints, smudges, marring, and other contaminants on the outer and/or upper surfaces of the anti-fingerprint coating layer 190. The anti-fingerprint coating layer 190 contains one or more materials which can be or include a fluorosilane, a perfluoropolyether-containing silane polymer, a chlorosilane, an oxysilane, a fluoroethylene, a perfluoropolyether, a nitrogen fluoride or nitrogen-fluorine containing compound, a polymer thereof, a dopant thereof, or any combination thereof.

The anti-fingerprint coating layer 190 is deposited or otherwise produced by one or more deposition processes which can be or include PVD, ion beam evaporation, CVD, spin coating, spray coating, dip coating, thermal curing, or any combination thereof. In one or more embodiments, the anti-fingerprint coating layer 190 can be formed, treated, and/or otherwise processed on a sheet-to-sheet processing system or a roll-to-roll processing system. For example, the anti-fingerprint coating layer 190 can deposited, coated, or otherwise formed on an underlying surface, layer, or device by one or more sheet-to-sheet or roll-to-roll process techniques.

The anti-fingerprint coating layer 190 has a surface energy of about 5 dyne/cm, about 10 dyne/cm, about 15 dyne/cm, about 18 dyne/cm, or about 20 dyne/cm to about 25 dyne/cm, about 30 dyne/cm, about 40 dyne/cm, about 50 dyne/cm, about 60 dyne/cm, about 70 dyne/cm, about 80 dyne/cm, or about 100 dyne/cm. For example, the anti-fingerprint coating layer 190 has a surface energy within a range from about 5 dyne/cm to about 100 dyne/cm, about 5 dyne/cm to about 80 dyne/cm, about 5 dyne/cm to about 70 dyne/cm, about 5 dyne/cm to about 50 dyne/cm, about 5 dyne/cm to about 40 dyne/cm, about 5 dyne/cm to about 30 dyne/cm, about 5 dyne/cm to about 20 dyne/cm, about 10 dyne/cm to about 100 dyne/cm, about 10 dyne/cm to about 80 dyne/cm, about 10 dyne/cm to about 70 dyne/cm, about 10 dyne/cm to about 50 dyne/cm, about 10 dyne/cm to about 40 dyne/cm, about 10 dyne/cm to about 30 dyne/cm, about 10 dyne/cm to about 20 dyne/cm, about 30 dyne/cm to about 100 dyne/cm, about 30 dyne/cm to about 80 dyne/cm, about 30 dyne/cm to about 70 dyne/cm, about 30 dyne/cm to about 50 dyne/cm, or about 30 dyne/cm to about 40 dyne/cm.

The anti-fingerprint coating layer 190 has a thickness of about 0.5 nm, about 1 nm, about 2 nm, about 3 nm, about 4 nm, about 5 nm, about 8 nm, or about 10 nm to about 12 nm, about 15 nm, about 18 nm, about 20 nm, about 25 nm, about 30 nm, about 35 nm, about 40 nm, about 50 nm, about 60 nm, about 80 nm, about 100 nm, or greater. For example, the anti-fingerprint coating layer 190 has a thickness of about 1 nm to about 100 nm, about 1 nm to about 80 nm, about 1 nm to about 50 nm, about 1 nm to about 40 nm, about 1 nm to about 35 nm, about 1 nm to about 30 nm, about 1 nm to about 25 nm, about 1 nm to about 20 nm, about 1 nm to about 15 nm, about 1 nm to about 10 nm, about 1 nm to about 8 nm, about 1 nm to about 5 nm, about 3 nm to about 100 nm, about 3 nm to about 80 nm, about 3 nm to about 50 nm, about 3 nm to about 40 nm, about 3 nm to about 35 nm, about 3 nm to about 30 nm, about 3 nm to about 25 nm, about 3 nm to about 20 nm, about 3 nm to about 15 nm, about 3 nm to about 10 nm, about 3 nm to about 8 nm, about 3 nm to about 5 nm, about 5 nm to about 100 nm, about 5 nm to about 80 nm, about 5 nm to about 50 nm, about 5 nm to about 40 nm, about 5 nm to about 35 nm, about 5 nm to about 30 nm, about 5 nm to about 25 nm, about 5 nm to about 20 nm, about 5 nm to about 15 nm, about 5 nm to about 10 nm, about 5 nm to about 8 nm, about 10 nm to about 100 nm, about 10 nm to about 80 nm, about 10 nm to about 50 nm, about 10 nm to about 40 nm, about 10 nm to about 35 nm, about 10 nm to about 30 nm, about 10 nm to about 25 nm, about 10 nm to about 20 nm, about 10 nm to about 15 nm, about 20 nm to about 50 nm, about 20 nm to about 30 nm, about 50 nm to about 250 nm, about 50 nm to about 200 nm, about 50 nm to about 150 nm, about 50 nm to about 100 nm, or about 50 nm to about 80 nm.

FIG. 2 depicts a schematic, cross-sectional view of a display device 200 containing a flexible cover lens assembly 202 disposed on the FDS 104, according to one or more embodiments described and discussed herein. The flexible cover lens assembly 202 contains the moisture barrier layer 130, the impact absorption layer 120 disposed on the moisture barrier layer 130, and the substrate 140 disposed on the impact absorption layer 120, and the wet hardcoat layer 150 disposed on the substrate 140. The flexible cover lens assembly 202 also contains the adhesion promotion layer 160 disposed on the wet hardcoat layer 150, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180. In some examples, the impact absorption layer 120 is disposed between and in contact with the moisture barrier layer 130 and the substrate 140.

FIG. 3 depicts a schematic, cross-sectional view of a display device 300 containing a flexible cover lens assembly 302 disposed on the FDS 104, according to one or more embodiments described and discussed herein. The flexible cover lens assembly 302 contains the moisture barrier layer 130, the impact absorption layer 120 disposed on the moisture barrier layer 130, the substrate 140 disposed on the impact absorption layer 120, and the adhesion promotion layer 160 disposed on the substrate 140. The flexible cover lens assembly 302 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 4 depicts a schematic, cross-sectional view of a display device 400 containing a flexible cover lens assembly 402 disposed on the FDS 104, according to one or more embodiments described and discussed herein. The flexible cover lens assembly 402 contains the moisture barrier layer 130, the substrate 140 disposed on the moisture barrier layer 130, and the wet hardcoat layer 150 disposed on the substrate 140. The flexible cover lens assembly 402 also contains the adhesion promotion layer 160 disposed on the wet hardcoat layer 150, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 5 depicts a schematic, cross-sectional view of a display device 500 containing a flexible cover lens assembly 502 disposed on the FDS 104, according to one or more embodiments described and discussed herein. The flexible cover lens assembly 502 contains the glass layer 110, the impact absorption layer 120 disposed on the glass layer 110, the substrate 140 disposed on the impact absorption layer 120, and the wet hardcoat layer 150 disposed on the substrate 140. The flexible cover lens assembly 502 also contains the adhesion promotion layer 160 disposed on the wet hardcoat layer 150, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180. In some examples, the wet hardcoat layer 150 is disposed between and in contact with the substrate 140 and the adhesion promotion layer 160.

FIG. 6 depicts a schematic, cross-sectional view of a display device 600 containing a flexible cover lens assembly 602 disposed on the FDS 104, according to one or more embodiments described and discussed herein. The flexible cover lens assembly 602 contains the impact absorption layer 120, the glass layer 110 disposed on the impact absorption layer 120, the substrate 140 disposed on the glass layer 110, and the wet hardcoat layer 150 disposed on the substrate 140. The flexible cover lens assembly 602 also contains the adhesion promotion layer 160 disposed on the wet hardcoat layer 150, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180. In one or more examples, the glass layer 110 is disposed between and in contact with the impact absorption layer 120 and the substrate 140.

FIG. 7 depicts a schematic, cross-sectional view of a display device 700 containing a flexible cover lens assembly 702 disposed on the FDS 104, according to one or more embodiments described and discussed herein. The flexible cover lens assembly 702 contains the glass layer 110, the impact absorption layer 120 disposed on the glass layer 110, the substrate 140 disposed on the impact absorption layer 120, and the adhesion promotion layer 160 disposed on the substrate 140. The flexible cover lens assembly 702 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 8 depicts a schematic, cross-sectional view of a display device 800 containing a flexible cover lens assembly 802 disposed on the FDS 104, according to one or more embodiments described and discussed herein. The flexible cover lens assembly 802 contains the impact absorption layer 120, the substrate 140 disposed on the impact absorption layer 120, the wet hardcoat layer 150 disposed on the substrate 140, and the adhesion promotion layer 160 disposed on the wet hardcoat layer 150. The flexible cover lens assembly 802 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 9 depicts a schematic, cross-sectional view of a display device 900 containing a flexible cover lens assembly 902 disposed on the FDS 104, according to one or more embodiments described and discussed herein. The flexible cover lens assembly 902 contains the glass layer 110, the substrate 140 disposed on the substrate 140, the wet hardcoat layer 150 disposed on the substrate 140, and the adhesion promotion layer 160 disposed on the wet hardcoat layer 150. The flexible cover lens assembly 902 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 10 depicts a schematic, cross-sectional view of a display device 1000 containing a flexible cover lens assembly 1002 disposed on the FDS 104, according to one or more embodiments described and discussed herein. The flexible cover lens assembly 1002 contains the substrate 140, the wet hardcoat layer 150 disposed on the substrate 140, and the adhesion promotion layer 160 disposed on the wet hardcoat layer 150. The flexible cover lens assembly 1002 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 11 depicts a schematic, cross-sectional view of a display device 1100 containing a flexible cover lens assembly 1102 disposed on the FDS 104, according to one or more embodiments described and discussed herein. The flexible cover lens assembly 1102 contains the glass layer 110, the substrate 140 disposed on the glass layer 110, and the adhesion promotion layer 160 disposed on the substrate 140. The flexible cover lens assembly 1102 also contains the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180. In some examples, the substrate 140 is disposed between and in contact with the glass layer 110 and the adhesion promotion layer 160.

FIG. 12 depicts a schematic, cross-sectional view of a display device 1200 containing a flexible cover lens assembly 1202 disposed on the FDS 104, according to one or more embodiments described and discussed herein. The flexible cover lens assembly 1202 contains the glass layer 110, the substrate 140 disposed on the glass layer 110, and the wet hardcoat layer 150 disposed on the substrate 140. The flexible cover lens assembly 1202 also contains the anti-reflectance layer 170 disposed on the wet hardcoat layer 150, the adhesion promotion layer 160 disposed on the anti-reflectance layer 170, and the anti-fingerprint coating layer 190 disposed on the adhesion promotion layer 160.

FIG. 13 depicts a schematic, cross-sectional view of a display device 1300 containing a flexible cover lens assembly 1302 disposed on the FDS 104, according to one or more embodiments described and discussed herein. The flexible cover lens assembly 1302 contains the glass layer 110, the adhesion promotion layer 160 disposed on the glass layer 110, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180. In some examples, the adhesion promotion layer 160 is disposed between and in contact with the glass layer 110 and the anti-reflectance layer 170.

FIG. 14 depicts a schematic, cross-sectional view of a display device 1400 containing a flexible cover lens assembly 1402 disposed on the FDS 104, according to one or more embodiments described and discussed herein. The flexible cover lens assembly 1402 contains the adhesion promotion layer 160, the anti-reflectance layer 170 disposed on the adhesion promotion layer 160, the dry hardcoat layer 180 disposed on the anti-reflectance layer 170, and the anti-fingerprint coating layer 190 disposed on the dry hardcoat layer 180.

FIG. 15 depicts a schematic, cross-sectional view of a display device 1500 containing a flexible cover lens assembly 1502 disposed on the FDS 104, according to one or more embodiments described and discussed herein. The flexible cover lens assembly 1502 contains the glass layer 110, the substrate 140 disposed on the glass layer 110, the wet hardcoat layer 150 is disposed on the substrate 140, and the adhesion promotion layer 160 disposed on the wet hardcoat layer 150. The flexible cover lens assembly 1502 also contains the dry hardcoat layer 180 disposed on the adhesion promotion layer 160 and the anti-fingerprint coating layer 190 disposed on the dry hardcoat layer 180. In one or more examples, the wet hardcoat layer 150 is disposed between and in contact with the substrate 140 and the adhesion promotion layer 160.

FIG. 16 depicts a schematic, cross-sectional view of a display device 1600 containing a flexible cover lens assembly 1602 disposed on the FDS 104, according to one or more embodiments described and discussed herein. The flexible cover lens assembly 1602 contains the glass layer 110, the substrate 140 disposed on the glass layer 110, the adhesion promotion layer 160 disposed on the substrate 140, the dry hardcoat layer 180 disposed on the adhesion promotion layer 160, and the anti-fingerprint coating layer 190 disposed on the dry hardcoat layer 180. In one or more examples, the substrate 140 is disposed between and in contact with the glass layer 110 and the adhesion promotion layer 160.

Figure 17:
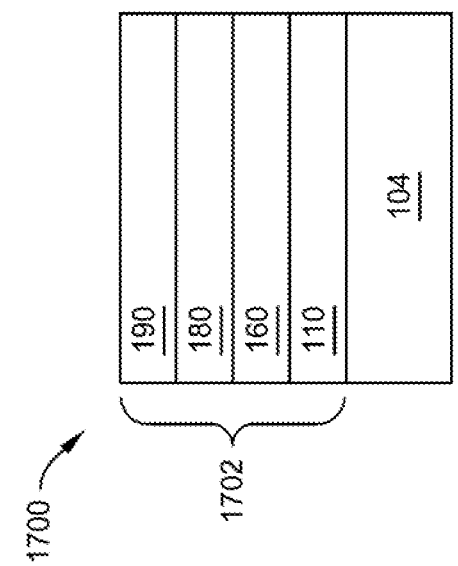
FIG. 17 depicts a schematic, cross-sectional view of a display device containing another flexible cover lens assembly, according to one or more embodiments described and discussed herein.

FIG. 17 depicts a schematic, cross-sectional view of a display device 1700 containing a flexible cover lens assembly 1702 disposed on the FDS 104, according to one or more embodiments described and discussed herein. The flexible cover lens assembly 1702 contains the glass layer 110, the adhesion promotion layer 160 disposed on the glass layer 110, the dry hardcoat layer 180 disposed on the adhesion promotion layer 160, and the anti-fingerprint coating layer 190 disposed on the dry hardcoat layer 180.

FIG. 18 depicts a schematic, cross-sectional view of a display device 1800 containing a flexible cover lens assembly 1802 disposed on the FDS 104, according to one or more embodiments described and discussed herein. The flexible cover lens assembly 1802 contains the substrate 140, a wet hardcoat layer 150 disposed on the substrate 140, the adhesion promotion layer 160 disposed on the wet hardcoat layer 150, the dry hardcoat layer 180 disposed on the adhesion promotion layer 160, and the anti-fingerprint coating layer 190 disposed on the dry hardcoat layer 180.

FIG. 19 depicts a schematic, cross-sectional view of a display device 1900 containing a flexible cover lens assembly 1902 disposed on the FDS 104, according to one or more embodiments described and discussed herein. The flexible cover lens assembly 1902 contains the substrate 140, the anti-fingerprint coating layer 190, and the adhesion promotion layer 160 disposed between the substrate 140 and the anti-fingerprint coating layer 190.

FIG. 20 depicts a schematic, cross-sectional view of a display device 2000 containing a flexible cover lens assembly 2002 disposed on the FDS 104, according to one or more embodiments described and discussed herein. The flexible cover lens assembly 2002 contains the substrate 140, the adhesion promotion layer 160 disposed on the substrate 140, the dry hardcoat layer 180 disposed on the adhesion promotion layer 160, and the anti-fingerprint coating layer 190 disposed on the dry hardcoat layer 180. In some examples, the adhesion promotion layer 160 and/or the dry hardcoat layer 180 are disposed between the substrate 140 and the anti-fingerprint coating layer 190. Also, the dry hardcoat layer 180 is disposed between and in contact with the adhesion promotion layer 160 and the anti-fingerprint coating layer 190.

FIG. 21 depicts a schematic, cross-sectional view of a display device 2100 containing a flexible cover lens assembly 2102 disposed on the FDS 104, according to one or more embodiments described and discussed herein. The flexible cover lens assembly 2002 contains the anti-fingerprint coating layer 190, the adhesion promotion layer 160, and the dry hardcoat layer 180. The second hardcoat or dry hardcoat layer 180 is disposed between and in contact with the adhesion promotion layer 160 and the anti-fingerprint coating layer 190.

In one or more embodiments, any two, three or more of the FDS 104, the glass layer 110, the impact absorption layer 120, the moisture barrier layer 130, the substrate 140, the wet hardcoat layer 150, the adhesion promotion layer 160, the anti-reflectance layer 170, the dry hardcoat layer 180, and/or the anti-fingerprint coating layer 190 can be coupled, connected, adhered, bonded, attached, or otherwise held together by one or more adhesive layers (not shown). Each adhesive layer can independently be or include one or more optically clear adhesives (OCAs) and/or pressure-sensitive adhesive (PSAs). In one or more examples, each of the adhesive layers is applied as a liquid-based adhesive which dries and bonds the two adjacent surfaces together. In some examples, each of the adhesive layers is OCA two-sided tape that bonds the two adjacent surfaces together.

In other embodiments, any two, three or more of the FDS 104, the glass layer 110, the impact absorption layer 120, the moisture barrier layer 130, the substrate 140, the wet hardcoat layer 150, the adhesion promotion layer 160, the anti-reflectance layer 170, the dry hardcoat layer 180, and/or the anti-fingerprint coating layer 190 can be coupled, connected, adhered, bonded, attached, or otherwise held together without the use of an adhesive. As such, any or all of the adhesive layers may be excluded and the neighboring components or layers are held together with inherent bonding forces. For example, any two, three or more of the FDS 104, the glass layer 110, the impact absorption layer 120, the moisture barrier layer 130, the substrate 140, the wet hardcoat layer 150, the adhesion promotion layer 160, the anti-reflectance layer 170, the dry hardcoat layer 180, and/or the anti-fingerprint coating layer 190 can be coupled, connected, adhered, bonded, attached, or otherwise held together to the neighboring layer, film, or device and no adhesive layer is at the interface therebetween. Any neighboring layer, film, or device can be deposited or otherwise formed directly onto the other neighboring layer, film, or device.

FIG. 22 depicts a schematic, cross-sectional view of a display device 2200 containing a flexible cover lens assembly 2202 disposed on the FDS 104, according to one or more embodiments described and discussed herein. The flexible cover lens assembly 2202 contains the glass layer 110, a first adhesion promotion layer 160 disposed on the glass layer 110, the wet hardcoat layer 150 disposed on the first adhesion promotion layer 160, and a second adhesion promotion layer 160 disposed on the wet hardcoat layer 150. The flexible cover lens assembly 2202 also contains the dry hardcoat layer 180 disposed on the second adhesion promotion layer 160 and the anti-fingerprint coating layer 190 disposed on the dry hardcoat layer 180. In some examples, each of the first and second adhesion promotion layers 160 can independently be different from one another. In other examples, the first and second adhesion promotion layers 160 are identical to each other. In one or more examples, the anti-fingerprint coating layer 190 can have an inorganic-organic-inorganic layer stack.

FIG. 23 depicts a schematic, cross-sectional view of a display device 2300 containing a flexible and replaceable cover lens stack 2302 disposed on the FDS 104, according to one or more embodiments described and discussed herein. The flexible and replaceable cover lens stack 2302 contains a first flexible cover lens assembly 2310, a second flexible cover lens assembly 2330, and a sacrificial adhesion layer 2320 disposed between the first flexible cover lens assembly 2310 and the second flexible cover lens assembly 2330. Each of the first flexible cover lens assembly 2310 and the second flexible cover lens assembly 2330 can independently be or include any one of the flexible cover lens assemblies described and discussed herein (e.g., the flexible cover lens assembly 102, 202, 302, 402, 502, 602, 702, 802, 902, 1002, 1102, 1202, 1302, 1402, 1502, 1602, 1702, 1802, 1902, 2002, 2102, or 2202), where the first flexible cover lens assembly 2310 and the second flexible cover lens assembly 2330 are different from each other.

In one or more embodiments, if it is desirable to remove and replace the first flexible cover lens assembly 2310 (e.g., due to being scratched or suffering other damage), the sacrificial adhesion layer 2320 can be selectively degraded, destroyed, or otherwise removed in order to separate the first flexible cover lens assembly 2310 from the second flexible cover lens assembly 2330 or other display structure. The first flexible cover lens assembly 2310 can be separated from the second flexible cover lens assembly 2330 by exposing the sacrificial adhesion layer 2320 to a predetermined temperature, a predetermined wavelength and/or dosage of ultraviolet (UV) light, and/or a predetermined mechanical removal mechanism, as further discussed and described below.

The sacrificial adhesion layer 2320 contains one or more polymeric or oligomeric materials which can be or include an acrylate, a silicone, a thermoplastic adhesive, an elastomeric adhesive, and combinations thereof. The sacrificial adhesion layer 2320 is degradable at a temperature of about 60° C. to about 120° C. The sacrificial adhesion layer 2320 is degradable when exposed to ultraviolet light having a wavelength of about 350 nm to about 375 nm for a period of about 0.5 seconds to about 30 seconds.

In some examples, the sacrificial adhesion layer 2320 includes one or more OCAs. The sacrificial adhesion layer 2320 can be or include one or more polymeric or oligomeric materials, such as one or more acrylates, silicones, thermoplastic adhesives, elastomeric adhesives, or any combination thereof. The sacrificial adhesion layer 2320 provides a low shear modulus and allows the layer on top of the sacrificial adhesion layer 2320 to shear or slip relative to the layer below the sacrificial adhesion layer 2320. In one or more examples, the sacrificial adhesion layer 2320 can be formed from a liquid optically clear adhesive (LOCA) that can be dispensed in various ways and cured by UV exposure, or be heat, moisture, and/or pressure sensitive and be cured by adjusting or controlling the same. In some examples, the sacrificial adhesion layer 2320 is degradable at a predetermined temperature. For examples the sacrificial adhesion layer 2320 can be degradable a temperature of about 40° C., about 50° C., or about 60° C. to about 80° C., about 100° C., or about 120° C. In other examples, the sacrificial adhesion layer 2320 is degradable when exposed to UV light at predetermined wavelength and/or predetermined dosage. For example, the sacrificial adhesion layer 2320 is degradable when exposed to UV light having a wavelength of about 350 nm to about 375 nm, such as about 365 nm. The sacrificial adhesion layer 2320 can be degraded by exposing the adhesive to the UV light for a period of about 0.5 seconds, about 1 second, or about 5 seconds to about 30 seconds, about 60 seconds, or about 90 seconds.

The sacrificial adhesion layer 2320 contains an adhesive that is different than the adhesive in any other the adhesive layers, if any, contained in the flexible and replaceable cover lens stack 2302. The adhesive in the sacrificial adhesion layer 2320 can have a different composition than the adhesive in any other the adhesive layers, if any, contained in the first flexible cover lens assembly 2310 and the second flexible cover lens assembly 2330. The adhesive in the sacrificial adhesion layer 2320 is degraded or destroyed when exposed to a predetermined temperature or wavelength of UV light. As such, the adhesion or bond between the first flexible cover lens assembly 2310 and the second flexible cover lens assembly 2330 is broken and then the first flexible cover lens assembly 2310 and the second flexible cover lens assembly 2330 can be separated from each other. During same time period, the adhesive in any of the adhesive layers, if any, within the first flexible cover lens assembly 2310 and the second flexible cover lens assembly 2330 is not degraded or destroyed when exposed to the same predetermined temperature or wavelength of UV light and the adhesion or bonding between the components within the first flexible cover lens assembly 2310 and the second flexible cover lens assembly 2330 is preserved.

In one or more embodiments, the first flexible cover lens assembly 2310 and the second flexible cover lens assembly 2330 can independently have flexibility over repeated cycles to bend to as low as 1 mm inside radius of curvature or as low as 4 mm outside radius of curvature. In some embodiments, during bend operations of the display device containing the cover lens assembly 2300, the first flexible cover lens assembly 2310 can independently move relative to the second flexible cover lens assembly 2330 by slipping, shearing, and/or sliding mechanism provided by the sacrificial adhesion layer 2320. Such a slip, shear and/or slide plane that separates the first flexible cover lens assembly 2310 and the second flexible cover lens assembly 2330 may be engineered in the material of the sacrificial adhesion layer 2320. The first flexible cover lens assembly 2310 and the second flexible cover lens assembly 2330 can independently have an impact resistance, with or without the impact absorption layers, as measured by a standard ball drop test, showing an ability to withhold up to 130 g steel ball dropped from a 100 cm height, and in some examples, a height of greater than 100 cm, such as 120 cm to about 150 cm. In some example, the first flexible cover lens assembly 2310 and the second flexible cover lens assembly 2330 can independently have a scratch resistance as measured by a standard steel wool test loaded up to 1 kg and able to withstand a large number of cycles, for example, about 100 cycles to about 4,000 cycles. The first flexible cover lens assembly 2310 and the second flexible cover lens assembly 2330 can independently have a total transmission of about 85% to about 95%, a haze of less than 1%, a yellow index of B*<1, and a high fracture toughness.

FIG. 25 shows a schematic, cross-sectional view of a flexible display structure 304 that can be used as the flexible display structure 104 contained in the display devices 100, 200, 300, 400, 500, 600, 700, 800, 900, 1000, 1100, 1200, 1300, 1400, 1500, 1600, 1700, 1800, 1900, 2000, 2100, 2200, and 2300 (FIGS. 1-23), according to one or more embodiments described and discussed herein. The flexible display structure 104, 304 can be or include a flexible display, a rigid display, or other device and can be contained within a monitor, a display, a screen, a television, a phone (e.g., mobile phone, smart phone, or cellular phone), a computer or laptop, a tablet, a watch, or other electronic device. In one or more examples, the flexible display structure 304 includes a contrast enhancing layer or a polarizer layer 320, a touch panel 330, a display layer 340, a substrate 350, and a backing film 360. The polarizer layer 320 is or includes a multi-function film layer containing a polarizer film. The polarizer layer 320 is used to reduce unwanted reflections due to the reflective metal that makes up the electrode lines or metallic structures within the flexible display structure 304. The polarizer layer 320 can include a quarter-wave retarder and a linear polarizer formed from flexible lens film with a thickness of less than 0.2 mm.

The touch panel 330 can include a touch sensor IC board and a touch sensor (not shown). In one or more examples, the touch sensor IC board is a flexible and metal based printed circuit board. The display layer 340 can be or include one or more light emitting diode (LED) displays, one or more liquid crystal displays (LCDs), or other suitable display devices. In some examples, the display layer 340 is an organic light emitting diode (OLED) display. In some examples, the display layer 340 is a quantum dot (OD) display. In one or more examples, the display layer 340 may include a thin film encapsulation (TFE), an organic emitting layer, a driver IC board, and a thin film transistor (TFT).

The substrate 350 can be or include a flexible plastic or polymeric substrate. The substrate 350 can be transparent and/or colorless and in some examples, can be conductive. The substrate 350 can be or include one or more polyimide materials, polyester terephthalates, polyether ether ketones, transparent conductive polyesters, polycarbonates, polyaryletherketones, or any combination thereof. The backing film 360 can be or include one or more heat sink layers and/or one or more protective barrier layers.

Each of the components of the flexible display structure 104 can be adhered, bonded, or otherwise held together by one or more adhesives. For example, the polarizer layer 320 and the touch panel 330 are bonded together by an adhesive layer 325 disposed therebetween. The touch panel 330 and the display layer 340 are bonded together by an adhesive layer 335 disposed therebetween. The display layer 340 and the substrate 350 are bonded together by an adhesive layer 345 disposed therebetween. The substrate 350 and the backing film 360 are bonded together by an adhesive layer 355 disposed therebetween. Each of the adhesive layers 325, 335, 345, 355 can independently be or include one or more OCA. In one or more examples, each of the adhesive layers 325, 335, 345, 355 is applied as a liquid-based adhesive which dries and bonds the two adjacent surfaces together. In some examples, each of the adhesive layers 325, 335, 345, 355 is OCA two-sided tape that bonds the two adjacent surfaces together. In other embodiments, each of the adhesive layers 325, 335, 345, 355 is independently not disposed between their respective neighboring layers which are held together by other bonding ways. For example, any of the layers or components within the flexible display structure 104 can be deposited or otherwise formed onto the neighboring layer or component.

The flexible cover lens assemblies 102, 202, 302, 402, 502, 602, 702, 802, 902, 1002, 1102, 1202, 1302, 1402, 1502, 1602, 1702, 1802, 1902, 2002, 2102, 2202, and 2310, and/or 2330, the display devices 100, 200, 300, 400, 500, 600, 700, 800, 900, 1000, 1100, 1200, 1300, 1400, 1500, 1600, 1700, 1800, 1900, 2000, 2100, 2200, and/or 2300 (FIGS. 1-23), the flexible display structures 104, 304 and/or any layers, films, or coating thereof, can be manufactured using chemical vapor deposition (CVD), plasma-enhanced CVD (PE-CVD), atomic layer deposition (ALD), plasma-enhanced ALD (PE-ALD), physical vapor deposition (PVD) or sputtering, sheet-to-sheet processing, roll-to-roll processing, photo-lithography, etching, other film coating and curing processes, and/or other such suitable manufacturing processes. Suitable manufacturing devices may be purchased from Applied Materials, Inc. of Santa Clara, Calif.

The flexible cover lens assemblies (including flexible cover lens assemblies 102, 202, 302, 402, 502, 602, 702, 802, 902, 1002, 1102, 1202, 1302, 1402, 1502, 1602, 1702, 1802, 1902, 2002, 2102, 2202, and 2310, and/or 2330, the display devices 100, 200, 300, 400, 500, 600, 700, 800, 900, 1000, 1100, 1200, 1300, 1400, 1500, 1600, 1700, 1800, 1900, 2000, 2100, 2200, and/or 2300 (FIGS. 1-23)), the flexible display structures (including flexible display structures 104, 304), and/or any layers, films, or coating thereof, can have a critical strain of greater than 1%, such as about 1.5%, about 2%, about 2.5%, about 3%, about 4%, or about 5% to about 5.5%, about 6%, about 7%, about 8%, about 9%, about 10%, about 11%, about 12%, about 15%, or greater. For example, the flexible cover lens assemblies, the flexible display structures, and/or any layers, films, or coating thereof, can have a critical strain of greater than 1% to about 15%, about 2% to about 15%, about 3% to about 15%, about 5% to about 15%, about 6% to about 15%, about 8% to about 15%, about 10% to about 15%, about 2% to about 12%, about 3% to about 12%, about 5% to about 12%, about 6% to about 12%, about 8% to about 12%, about 10% to about 12%, about 2% to about 10%, about 3% to about 10%, about 5% to about 10%, about 6% to about 10%, about 8% to about 10%, about 2% to about 7%, about 3% to about 7%, about 4% to about 7%, or about 5% to about 7%. Critical strain is measured using an Ultimate Tensile Testing Machine with a prescribed elongation of the flexible cover lens assembly or other layered stack. The maximum tensile elongation survived by the flexible cover lens assembly or other layered stack without crack failure is defined as the critical strain of the flexible cover lens assembly or other layered stack.

The flexible cover lens and the flexible cover lens assemblies discussed and described herein may be used in any type of display device. The flexible cover lens and the flexible cover lens assemblies have strong strength, flexibility, elasticity, optical transmission, wear resistance, and/or thermo-stability. By utilizing a sacrificial adhesion layer containing degradable optically clear adhesive between a first flexible cover lens and a second flexible cover lens, or between a first flexible cover lens and a display structure or display device, if damage occurs, the first flexible cover lens can easily be removed (and replaced with a new cover lens) without damage to the underlying structures or devices.

In one or more embodiments, although flexibility requirements are dependent on specific foldable display design and product configurations, in general, the foldable cover lens, as described and discussed herein, have enough flexibility to sustain repeated bend cycles, with each cycle folding the flexible cover lens to a radius of curvature of 5 mm or less. In terms of critical strain, the flexibility of the cover lens can be indicated by the critical strain the cover lens is able to withstand, with greater than 1 critical strain.

Embodiments of the present disclosure further relate to any one or more of the following paragraphs 1-93:

1. A flexible cover lens assembly, comprising: a glass layer; an adhesion promotion layer on the glass layer; an anti-reflectance layer disposed on the adhesion promotion layer; a dry hardcoat layer having a nano-indentation hardness in a range from about 1 GPa to about 5 GPa and disposed on the anti-reflectance layer; and an anti-fingerprint coating layer disposed on the dry hardcoat layer.

2. A flexible cover lens assembly, comprising: a glass layer; a substrate disposed on the glass layer; an adhesion promotion layer on the substrate; an anti-reflectance layer disposed on the adhesion promotion layer; a dry hardcoat layer having a porosity of about 1% to about 7% and disposed on the anti-reflectance layer; and an anti-fingerprint coating layer disposed on the dry hardcoat layer.

3. A flexible cover lens assembly, comprising: a glass layer; a substrate disposed on the glass layer; a wet hardcoat layer having a nano-indentation hardness in a range from about 0.4 GPa to about 1.5 GPa and disposed on the substrate; an anti-reflectance layer disposed on the wet hardcoat layer; an adhesion promotion layer disposed on the anti-reflectance layer; and an anti-fingerprint coating layer disposed on the adhesion promotion layer.

4. A flexible cover lens assembly, comprising: a glass layer; an adhesion promotion layer disposed on the glass layer; a dry hardcoat layer having a nano-indentation hardness in a range from about 1 GPa to about 5 GPa and disposed on the adhesion promotion layer; and an anti-fingerprint coating layer disposed on the dry hardcoat layer.

5. A flexible cover lens assembly, comprising: a glass layer; a substrate disposed on the glass layer; an adhesion promotion layer disposed on the substrate; a dry hardcoat layer having a porosity of about 1% to about 7% and disposed on the adhesion promotion layer; and an anti-fingerprint coating layer disposed on the dry hardcoat layer.

6. A flexible cover lens assembly, comprising: a glass layer; a substrate disposed on the glass layer; a wet hardcoat layer having a nano-indentation hardness in a range from about 0.4 GPa to about 1.5 GPa and disposed on the substrate; an adhesion promotion layer disposed on the wet hardcoat layer; a dry hardcoat layer disposed on the adhesion promotion layer and having a nano-indentation hardness in a range from about 1 GPa to about 5 GPa and a porosity of about 1% to about 7%; and an anti-fingerprint coating layer disposed on the dry hardcoat layer.

7. A flexible cover lens assembly, comprising: a substrate; an anti-fingerprint coating layer; and an adhesion promotion layer disposed between the substrate and the anti-fingerprint coating layer.

8. A flexible cover lens assembly, comprising: a substrate; an adhesion promotion layer disposed on the substrate; a dry hardcoat layer disposed on the adhesion promotion layer and having a porosity of about 1% to about 7% and a nano-indentation hardness in a range from about 1 GPa to about 5 GPa; and an anti-fingerprint coating layer disposed on the dry hardcoat layer.

9. A flexible cover lens assembly, comprising: a substrate; a wet hardcoat layer having a nano-indentation hardness in a range from about 0.4 GPa to about 1.5 GPa and disposed on the substrate; an adhesion promotion layer disposed on the wet hardcoat layer; a dry hardcoat layer having a nano-indentation hardness in a range from about 1 GPa to about 5 GPa and disposed on the adhesion promotion layer; and an anti-fingerprint coating layer disposed on the dry hardcoat layer.

10. A flexible cover lens assembly, comprising: a glass layer; an impact absorption layer disposed on the glass layer; a moisture barrier layer disposed on the impact absorption layer; a substrate disposed on the moisture barrier layer; a wet hardcoat layer having a nano-indentation hardness in a range from about 0.4 GPa to about 1.5 GPa and disposed on the substrate; an adhesion promotion layer disposed on the wet hardcoat layer; an anti-reflectance layer disposed on the adhesion promotion layer; a dry hardcoat layer having a nano-indentation hardness in a range from about 1 GPa to about 5 GPa and disposed on the anti-reflectance layer; and an anti-fingerprint coating layer disposed on the dry hardcoat layer.

11. A flexible cover lens assembly, comprising: a glass layer; a first adhesion promotion layer disposed on the glass layer; a wet hardcoat layer having a nano-indentation hardness in a range from about 0.4 GPa to about 1.5 GPa and disposed on the first adhesion promotion layer; a second adhesion promotion layer disposed on the wet hardcoat layer; a dry hardcoat layer having a nano-indentation hardness in a range from about 1 GPa to about 5 GPa and disposed on the second adhesion promotion layer; and an anti-fingerprint coating layer disposed on the dry hardcoat layer.

12. A flexible cover lens assembly, comprising: a glass layer; a first adhesion promotion layer disposed on the glass layer; a wet hardcoat layer having a porosity of about 6% to about 10% and disposed on the first adhesion promotion layer; a second adhesion promotion layer disposed on the wet hardcoat layer; a dry hardcoat layer having a porosity of about 1% to about 7% and disposed on the second adhesion promotion layer; and an anti-fingerprint coating layer disposed on the dry hardcoat layer, wherein the flexible cover lens assembly has a critical strain of greater than 1% to about 15%.

13. A flexible cover lens assembly, comprising: an anti-fingerprint coating layer; an adhesion promotion layer; and a dry hardcoat, wherein the dry hardcoat layer is disposed between the adhesion promotion layer and the anti-fingerprint coating layer.

14. A flexible cover lens assembly, comprising: a substrate; a wet hardcoat layer disposed on the substrate; an adhesion promotion layer disposed on the wet hardcoat layer; an anti-reflectance layer disposed on the adhesion promotion layer; a dry hardcoat layer disposed on the anti-reflectance layer; and an anti-fingerprint coating layer disposed on the dry hardcoat layer.

15. A flexible cover lens assembly, comprising: a glass layer; a substrate disposed on the glass layer; a wet hardcoat layer disposed on the substrate; an adhesion promotion layer disposed on the wet hardcoat layer; an anti-reflectance layer disposed on the adhesion promotion layer; a dry hardcoat layer disposed on the anti-reflectance layer; and an anti-fingerprint coating layer disposed on the dry hardcoat layer.

16. A flexible cover lens assembly, comprising: a glass layer; an impact absorption layer disposed on the glass layer; a substrate disposed on the impact absorption layer; an adhesion promotion layer disposed on the substrate; an anti-reflectance layer disposed on the adhesion promotion layer; a dry hardcoat layer disposed on the anti-reflectance layer; and an anti-fingerprint coating layer disposed on the dry hardcoat layer.

17. The flexible cover lens assembly of paragraph 16, further comprising a wet hardcoat layer, wherein the wet hardcoat layer is disposed between the substrate and the adhesion promotion layer.

18. A flexible cover lens assembly, comprising: an impact absorption layer; a substrate disposed on the impact absorption layer; a wet hardcoat layer disposed on the substrate; an adhesion promotion layer disposed on the wet hardcoat layer; an anti-reflectance layer disposed on the adhesion promotion layer; a dry hardcoat layer disposed on the anti-reflectance layer; and an anti-fingerprint coating layer disposed on the dry hardcoat layer.

19. The flexible cover lens assembly of paragraph 18, further comprising a glass layer disposed between the impact absorption layer and the substrate.

20. A flexible cover lens assembly, comprising: a moisture barrier layer; a substrate disposed on the moisture barrier layer; a wet hardcoat layer disposed on the substrate; an adhesion promotion layer disposed on the wet hardcoat layer; an anti-reflectance layer disposed on the adhesion promotion layer; a dry hardcoat layer disposed on the anti-reflectance layer; and an anti-fingerprint coating layer disposed on the dry hardcoat layer.

21. The flexible cover lens assembly of paragraph 20, further comprising an impact absorption layer disposed between the moisture barrier layer and the substrate.

22. A flexible cover lens assembly, comprising: a moisture barrier layer; an impact absorption layer disposed on the moisture barrier layer; a substrate disposed on the impact absorption layer; an adhesion promotion layer disposed on the substrate; an anti-reflectance layer disposed on the adhesion promotion layer; a dry hardcoat layer disposed on the anti-reflectance layer; and an anti-fingerprint coating layer disposed on the dry hardcoat layer.

23. The flexible cover lens assembly according to any one of paragraphs 1-22, wherein the flexible cover lens assembly has a critical strain of greater than 1% to about 15%.

24. The flexible cover lens assembly according to any one of paragraphs 1-23, wherein the flexible cover lens assembly has a critical strain of about 2% to about 12%.

25. The flexible cover lens assembly according to any one of paragraphs 1-24, further comprising a substrate disposed between the glass layer and the adhesion promotion layer.

26. The flexible cover lens assembly according to any one of paragraphs 1-25, wherein the glass layer is an ultra-thin glass layer and has thickness in a range from about 20 µm to about 100 µm.

27. The flexible cover lens assembly according to any one of paragraphs 1-26, wherein the dry hardcoat layer comprises a material selected from the group consisting of silicon oxide, silicon carbide, silicon oxycarbide, silicon nitride, silicon oxynitride, silicon oxycarbide nitride, a dopant thereof, and any combination thereof.

28. The flexible cover lens assembly according to any one of paragraphs 1-27, wherein the dry hardcoat layer is produced from a vapor deposition process and has a nano-indentation hardness in a range from about 1.5 GPa to about 4.5 GPa.

29. The flexible cover lens assembly according to any one of paragraphs 1-28, wherein the dry hardcoat layer has a porosity of about 1% to about 7%.

30. The flexible cover lens assembly according to any one of paragraphs 1-29, wherein the dry hardcoat layer has a refractive index of about 1.42 to about 1.55.

31. The flexible cover lens assembly according to any one of paragraphs 1-30, wherein the dry hardcoat layer has a refractive index of about 1.45 to about 1.51.

32. The flexible cover lens assembly according to any one of paragraphs 1-31, wherein the dry hardcoat layer has a thickness in a range from about 0.5 µm to about 40 µm.

33. The flexible cover lens assembly according to any one of paragraphs 1-32, wherein the dry hardcoat layer is produced from a vapor deposition process.

34. The flexible cover lens assembly according to any one of paragraphs 1-33, wherein the dry hardcoat layer is produced from a vapor deposition process selected from the group consisting of PVD, CVD, PE-CVD, HDP-CVD, ALD, PE-ALD, and any combination thereof.

35. The flexible cover lens assembly according to any one of paragraphs 1-34, wherein the wet hardcoat layer comprises an acrylate, a solgel, a siloxane, a copolymer thereof, an elastomer thereof, or any combination thereof.

36. The flexible cover lens assembly according to any one of paragraphs 1-35, wherein the wet hardcoat layer comprises an acrylate, and wherein the acrylate comprises a radiation curable acrylate, aliphatic urethane acrylate, a copolymer thereof, an elastomer thereof, or any combination thereof.

37. The flexible cover lens assembly according to any one of paragraphs 1-36, wherein the wet hardcoat layer is produced from a gel, a spin-coating, a solution, a suspension, or any combination thereof.

38. The flexible cover lens assembly according to any one of paragraphs 1-37, wherein the wet hardcoat layer has a porosity of about 6% to about 10%.

39. The flexible cover lens assembly according to any one of paragraphs 1-38, wherein the wet hardcoat layer has a refractive index of about 1.40 to about 1.55.

40. The flexible cover lens assembly according to any one of paragraphs 1-39, wherein the wet hardcoat layer has a refractive index of about 1.43 to about 1.51.

41. The flexible cover lens assembly according to any one of paragraphs 1-40, wherein the wet hardcoat layer has a nano-indentation hardness in a range from about 0.5 GPa to about 1.2 GPa.

42. The flexible cover lens assembly according to any one of paragraphs 1-41, wherein the wet hardcoat layer has a thickness in a range from about 0.5 µm to about 40 µm.

43. The flexible cover lens assembly according to any one of paragraphs 1-42, further comprising a substrate disposed between the glass layer and the adhesion promotion layer.

44. The flexible cover lens assembly according to any one of paragraphs 1-43, further comprising a wet hardcoat layer having a nano-indentation hardness in a range from about 0.4 GPa to about 1.5 GPa, and wherein the wet hardcoat layer is disposed between the substrate and the adhesion promotion layer.

45. The flexible cover lens assembly according to any one of paragraphs 1-44, further comprising a dry hardcoat layer having a nano-indentation hardness in a range from about 1 GPa to about 5 GPa, wherein the dry hardcoat layer is disposed between the adhesion promotion layer and the anti-fingerprint coating layer.

46. The flexible cover lens assembly according to any one of paragraphs 1-45, wherein the adhesion promotion layer comprises a material selected from the group consisting of silicon oxide, silicon carbide, silicon oxycarbide, silicon nitride, silicon oxynitride, silicon oxycarbide nitride, a dopant thereof, and any combination thereof.

47. The flexible cover lens assembly according to any one of paragraphs 1-46, wherein the adhesion promotion layer has a gradient of carbon concentration across a thickness of the adhesion promotion layer.

48. The flexible cover lens assembly according to any one of paragraphs 1-47, wherein the adhesion promotion layer comprises from about 2 sublayers to about 10 sublayers.

49. The flexible cover lens assembly according to any one of paragraphs 1-48, wherein the adhesion promotion layer comprises a plurality of sublayers contained therein, and wherein the plurality of sublayers comprises a gradient of carbon concentration across a thickness of the adhesion promotion layer.

50. The flexible cover lens assembly according to any one of paragraphs 1-49, wherein the adhesion promotion layer comprises a plurality of sublayers contained therein, and wherein the plurality of sublayers comprises a gradient of hardness across a thickness of the adhesion promotion layer.

51. The flexible cover lens assembly according to any one of paragraphs 1-50, wherein the adhesion promotion layer comprises a plurality of sublayers contained therein, and wherein the plurality of sublayers has a nano-indentation hardness across a thickness of the adhesion promotion layer within a range from about 0.1 GPa to about 5 GPa, as measured by nano-indentation technique.

52. The flexible cover lens assembly of paragraph 51, wherein the hardness is within a range from about 0.5 GPa to about 3.5 GPa, as measured by nano-indentation technique.

53. The flexible cover lens assembly according to any one of paragraphs 1-52, wherein the adhesion promotion layer is produced from a vapor deposition process.

54. The flexible cover lens assembly according to any one of paragraphs 1-53, wherein the adhesion promotion layer is produced from a vapor deposition process selected from the group consisting of PVD, sputtering, CVD, PE-CVD, HDP-CVD, ALD, PE-ALD, and any combination thereof.

55. The flexible cover lens assembly according to any one of paragraphs 1-54, wherein the adhesion promotion layer is produced from a silicon precursor and an oxidizing agent.

56. The flexible cover lens assembly of paragraph 55, wherein the silicon precursor comprises an alkylsilane, an alkoxysilane, an alkylsiloxane, an alkylsilazane, or any combination thereof.

57. The flexible cover lens assembly according to any one of paragraphs 1-56, wherein the adhesion promotion layer has a refractive index of about 1.40 to about 1.55.

58. The flexible cover lens assembly according to any one of paragraphs 1-57, wherein the adhesion promotion layer has a refractive index of about 1.43 to about 1.51.

59. The flexible cover lens assembly according to any one of paragraphs 1-58, wherein the adhesion promotion layer has a thickness in a range from about 0.04 µm to about 30 µm.

60. The flexible cover lens assembly according to any one of paragraphs 1-59, wherein the moisture barrier layer comprises a material selected from the group consisting of silicon oxide, silicon nitride, silicon oxynitride, a dopant thereof, and any combination thereof.

61. The flexible cover lens assembly according to any one of paragraphs 1-60, wherein the moisture barrier layer comprises from about 2 sublayers to about 5 sublayers.

62. The flexible cover lens assembly according to any one of paragraphs 1-61, wherein the moisture barrier layer comprises a plurality of sublayers contained therein.

63. The flexible cover lens assembly according to any one of paragraphs 1-62, wherein the moisture barrier layer comprises a film stack comprising a second sublayer disposed between a first sublayer and a third sublayer, and wherein the first sublayer comprises silicon nitride, the second sublayer comprises silicon oxide, and the third sublayer comprises silicon nitride.

64. The flexible cover lens assembly according to any one of paragraphs 1-63, wherein the moisture barrier layer is produced from a vapor deposition process.

65. The flexible cover lens assembly according to any one of paragraphs 1-64, wherein the moisture barrier layer is produced from a vapor deposition process selected from the group consisting of PVD, CVD, PE-CVD, HDP-CVD, ALD, PE-ALD, and any combination thereof.

66. The flexible cover lens assembly according to any one of paragraphs 1-65, wherein the moisture barrier layer has a water vapor transport rate (WVTR) within a range from about $1 \times 10^{-6}$ g/m²/day to about 10 g/m²/day.

67. The flexible cover lens assembly according to any one of paragraphs 1-66, wherein the moisture barrier layer has a thickness in a range from about 20 nm to about 500 nm.

68. The flexible cover lens assembly according to any one of paragraphs 1-67, wherein the moisture barrier layer has an optical transmission in the visible range within a range from about 85% to about 98%.

69. The flexible cover lens assembly according to any one of paragraphs 1-68, wherein the impact absorption layer comprises a material selected from the group consisting of ether urethane, ester urethane, aliphatic urethane, aliphatic polyurethane, aliphatic polyester urethane, polysulfide thermoset, poly amide, copolymers thereof, elastomers thereof, and any combination thereof.

70. The flexible cover lens assembly according to any one of paragraphs 1-69, wherein the impact absorption layer has a thickness in a range from about 1 μm to about 150 μm.

71. The flexible cover lens assembly according to any one of paragraphs 1-70, wherein the impact absorption layer has an optical transmission in the visible range within a range from about 85% to about 98%.

72. The flexible cover lens assembly according to any one of paragraphs 1-71, wherein the anti-fingerprint coating layer comprises a material selected from the group consisting of a perfluoropolyether-containing silane polymer, a chlorosilane, an oxysilane, a fluoroethylene, a perfluoropolyether, a dopant thereof, and any combination thereof.

73. The flexible cover lens assembly according to any one of paragraphs 1-72, wherein the anti-fingerprint coating layer is produced from a vapor deposition process.

74. The flexible cover lens assembly according to any one of paragraphs 1-73, wherein the anti-fingerprint coating layer is produced from a deposition process selected from the group consisting of PVD, ion beam evaporation, CVD, spin coating, spray coating, dip coating, thermal curing, and any combination thereof.

75. The flexible cover lens assembly according to any one of paragraphs 1-74, wherein the anti-fingerprint coating layer has a surface energy within a range from about 10 dyne/cm to about 80 dyne/cm.

76. The flexible cover lens assembly according to any one of paragraphs 1-75, wherein the anti-fingerprint coating layer has a surface energy within a range from about 30 dyne/cm to about 50 dyne/cm.

77. The flexible cover lens assembly according to any one of paragraphs 1-76, wherein the anti-fingerprint coating layer has a thickness in a range from about 3 nm to about 50 nm.

78. The flexible cover lens assembly according to any one of paragraphs 1-77, wherein the anti-reflectance layer has a refractive index of about 1.7 to about 2.3.

79. The flexible cover lens assembly according to any one of paragraphs 1-78, wherein the anti-reflectance layer has a refractive index of about 1.8 to about 2.1.

80. The flexible cover lens assembly according to any one of paragraphs 1-79, wherein the anti-reflectance layer has an optical transmission in the visible range within a range from about 85% to about 98%.

81. The flexible cover lens assembly according to any one of paragraphs 1-80, wherein the anti-reflectance layer has a thickness in a range from about 2 nm to about 150 nm.

82. The flexible cover lens assembly according to any one of paragraphs 1-81, wherein the anti-reflectance layer comprises a material selected from the group consisting of silicon nitride, silicon oxynitride, silicon carbide nitride, silicon oxycarbide nitride, a dopant thereof, and any combination thereof.

83. The flexible cover lens assembly according to any one of paragraphs 1-82, wherein the anti-reflectance layer comprises silicon nitride.

84. The flexible cover lens assembly according to any one of paragraphs 1-83, wherein the anti-reflectance layer is produced from a vapor deposition process.

85. The flexible cover lens assembly according to any one of paragraphs 1-84, wherein the anti-reflectance layer is produced from a vapor deposition process selected from the group consisting of sputtering, PVD, CVD, PE-CVD, HDP-CVD, ALD, PE-ALD, and any combination thereof.

86. The flexible cover lens assembly according to any one of paragraphs 1-85, wherein the substrate has a thickness in a range from about 5 μm to about 100 μm.

87. The flexible cover lens assembly according to any one of paragraphs 1-86, wherein the substrate comprises a material selected from the group consisting of a polyethylene terephthalate, a triacetylcellulose, a polycarbonate, a polyimide, a polyamide, a polysulfide, a polymethacrylic acid methyl ester, copolymers thereof, elastomers thereof, and any combination thereof.

88. A flexible and replaceable cover lens stack, comprising: a first flexible cover lens comprising the flexible cover lens assembly according to any one of paragraphs 1-87; a second flexible cover lens comprising the flexible cover lens assembly according to any one of paragraphs 1-87, wherein the first and second cover lens are different; and a sacrificial adhesion layer disposed between the first flexible cover lens and the second flexible cover lens.

89. The flexible and replaceable cover lens stack of paragraph 88, wherein the sacrificial adhesion layer comprises a polymeric or oligomeric material selected from the group consisting of an acrylate, a silicone, a thermoplastic adhesive, an elastomeric adhesive, and combinations thereof.

90. The flexible and replaceable cover lens stack of paragraph 88, wherein the sacrificial adhesion layer is degradable at a temperature of about 60° C. to about 120° C.

91. The flexible and replaceable cover lens stack of paragraph 88, wherein the sacrificial adhesion layer is degradable when exposed to ultraviolet light having a wavelength of about 350 nm to about 375 nm for a period of about 0.5 seconds to about 30 seconds.

92. A display device, comprising: the flexible cover lens assembly or the flexible and replaceable cover lens stack according to any one of paragraphs 1-91; and a flexible display structure.

93. The display device of paragraph 92, wherein the flexible display structure comprises an OLED display or an LCD display.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A flexible cover lens assembly, comprising:
a glass layer;
an impact absorption layer disposed directly on the glass layer;
a moisture barrier layer disposed directly on the impact absorption layer;
a substrate disposed on the moisture barrier layer;
a wet hardcoat layer disposed directly on the substrate;
an adhesion promotion layer disposed on the wet hardcoat layer, wherein the adhesion promotion layer comprises a material selected from the group consisting of silicon oxide, silicon carbide, silicon oxycarbide, silicon nitride, silicon oxynitride, silicon oxycarbide nitride, a dopant thereof, and any combination thereof, and wherein the adhesion promotion layer has a refractive index in a range from about 1.40 to about 1.55;
an anti-reflectance layer disposed on the adhesion promotion layer;
a dry hardcoat layer disposed on the anti-reflectance layer; and
an anti-fingerprint coating layer disposed on the dry hardcoat layer;
wherein the flexible cover lens assembly has a critical strain of greater than 1% to about 15%.

2. The flexible cover lens assembly of claim 1, wherein the flexible cover lens assembly has a critical strain in a range from about 1.5% to about 10%.

3. The flexible cover lens assembly of claim 1, wherein the glass layer is an ultra-thin glass layer and has thickness in a range from about 20 μm to about 100 μm.

4. The flexible cover lens assembly of claim 1, wherein the adhesion promotion layer comprises silicon oxide, silicon nitride, silicon oxynitride, or any combination thereof.

5. The flexible cover lens assembly of claim 1, wherein the adhesion promotion layer has a gradient of carbon concentration across a thickness of the adhesion promotion layer.

6. The flexible cover lens assembly of claim 1, wherein the adhesion promotion layer comprises from about 2 sublayers to about 10 sublayers.

7. The flexible cover lens assembly of claim 1, wherein the adhesion promotion layer comprises a plurality of sublayers contained therein, and wherein the plurality of sublayers comprises a gradient of carbon concentration across a thickness of the adhesion promotion layer.

8. The flexible cover lens assembly of claim 1, wherein the adhesion promotion layer comprises a plurality of sublayers contained therein, and wherein the plurality of sublayers comprises a gradient of hardness across a thickness of the adhesion promotion layer.

9. The flexible cover lens assembly of claim 1, wherein the adhesion promotion layer comprises a plurality of sublayers contained therein, and wherein the plurality of sublayers has a nano-indentation hardness across a thickness of the adhesion promotion layer within a range from about 0.1 GPa to about 5 GPa, as measured by nano-indentation technique.

10. The flexible cover lens assembly of claim 1, wherein the dry hardcoat layer comprises a material selected from the group consisting of silicon oxide, silicon carbide, silicon oxycarbide, silicon nitride, silicon oxynitride, silicon oxycarbide nitride, a dopant thereof, and any combination thereof, and wherein the wet hardcoat layer comprises an acrylate, and wherein the acrylate comprises a radiation curable acrylate, aliphatic urethane acrylate, a copolymer thereof, an elastomer thereof, or any combination thereof.

11. The flexible cover lens assembly of claim 1, wherein the dry hardcoat layer has a porosity of about 1% to about 7%, and wherein the wet hardcoat layer has a porosity of about 6% to about 10%.

12. The flexible cover lens assembly of claim 1, wherein the wet hardcoat layer has a nano-indentation hardness in a range from about 0.5 GPa to about 1.2 GPa, and wherein the wet hardcoat layer has a thickness in a range from about 0.5 μm to about 40 μm.

13. A flexible cover lens assembly, comprising:
a glass layer;
a first adhesion promotion layer disposed directly on the glass layer, wherein the first adhesion promotion layer comprises a material selected from the group consisting of silicon oxide, silicon carbide, silicon oxycarbide, silicon nitride, silicon oxynitride, silicon oxycarbide nitride, a dopant thereof, and any combination thereof, and wherein the first adhesion promotion layer has a refractive index in a range from about 1.40 to about 1.55;
a wet hardcoat layer disposed directly on the first adhesion promotion layer, wherein the wet hardcoat layer comprises an acrylate, and wherein the acrylate comprises a radiation curable acrylate, aliphatic urethane acrylate, a copolymer thereof, an elastomer thereof, or any combination thereof;
a second adhesion promotion layer disposed directly on the wet hardcoat layer;
a dry hardcoat layer disposed directly on the second adhesion promotion layer, wherein the dry hardcoat layer comprises a material selected from the group consisting of silicon carbide, silicon oxycarbide, silicon oxycarbide nitride, a dopant thereof, and any combination thereof, and wherein the dry hardcoat layer has:
a refractive index of about 1.42 to about 1.55; and
a porosity of about 1% to about 8%; and
an anti-fingerprint coating layer disposed on the dry hardcoat layer.

14. The flexible cover lens assembly of claim 13, wherein the flexible cover lens assembly has a critical strain in a range from about 1.5% to about 10%.

15. The flexible cover lens assembly of claim 13, wherein the dry hardcoat layer has a porosity of about 3% to about 7%, and wherein the wet hardcoat layer has a porosity of about 6% to about 10%.

16. The flexible cover lens assembly of claim 13, wherein the wet hardcoat layer has a refractive index of about 1.40 to about 1.55.

17. The flexible cover lens assembly of claim 13, wherein the wet hardcoat layer has a nano-indentation hardness in a range from about 0.5 GPa to about 1.2 GPa, and wherein the wet hardcoat layer has a thickness in a range from about 0.5 µm to about 40 µm.

18. A flexible cover lens assembly, comprising:
   a glass layer;
   a first adhesion promotion layer disposed directly on the glass layer, wherein the first adhesion promotion layer comprises a material selected from the group consisting of silicon oxide, silicon carbide, silicon oxycarbide, silicon nitride, silicon oxynitride, silicon oxycarbide nitride, a dopant thereof, and any combination thereof;
   a wet hardcoat layer disposed directly on the first adhesion promotion layer, wherein the wet hardcoat layer comprises an acrylate, and wherein the acrylate comprises a radiation curable acrylate, aliphatic urethane acrylate, a copolymer thereof, an elastomer thereof, or any combination thereof;
   a second adhesion promotion layer disposed directly on the wet hardcoat layer, wherein the second adhesion promotion layer comprises a material selected from the group consisting of silicon oxide, silicon carbide, silicon oxycarbide, silicon nitride, silicon oxynitride, silicon oxycarbide nitride, a dopant thereof, and any combination thereof;
   a dry hardcoat layer disposed directly on the second adhesion promotion layer, wherein the dry hardcoat layer comprises a material selected from the group consisting of silicon carbide, silicon oxycarbide, silicon oxycarbide nitride, a dopant thereof, and any combination thereof, and wherein the dry hardcoat layer has:
      a refractive index of about 1.42 to about 1.55; and
      a porosity of about 1% to about 8%; and
   an anti-fingerprint coating layer disposed on the dry hardcoat layer,
   wherein the flexible cover lens assembly has a critical strain of greater than 1% to about 15%.

19. The flexible cover lens assembly of claim 18, wherein the dry hardcoat layer has a porosity of about 3% to about 7%, and wherein the wet hardcoat layer has a porosity of about 6% to about 10%.

20. The flexible cover lens assembly of claim 18, wherein the wet hardcoat layer has:
   a refractive index of about 1.40 to about 1.55;
   a nano-indentation hardness in a range from about 0.5 GPa to about 1.2 GPa; and
   a thickness in a range from about 0.5 µm to about 40 µm.

* * * * *